(12) United States Patent
Aswell

(10) Patent No.: US 6,703,682 B2
(45) Date of Patent: Mar. 9, 2004

(54) HIGH SHEET MOS RESISTOR METHOD AND APPARATUS

(75) Inventor: Cecil James Aswell, Orangevale, CA (US)

(73) Assignee: Texas Advanced Optoelectronic Solutions, Inc., Plano, TX (US)

( * ) Notice: Subject to any disclaimer, the term of this patent is extended or adjusted under 35 U.S.C. 154(b) by 100 days.

(21) Appl. No.: 09/746,714

(22) Filed: Dec. 21, 2000

(65) Prior Publication Data

US 2001/0050410 A1 Dec. 13, 2001

Related U.S. Application Data

(60) Provisional application No. 60/171,725, filed on Dec. 22, 1999.

(51) Int. Cl.[7] .................. H01L 29/00; H03F 3/04; H03G 3/30
(52) U.S. Cl. ............... 257/536; 257/537; 330/303; 330/305; 330/306; 330/284
(58) Field of Search ................ 257/536, 537; 330/303, 306, 305, 284

(56) References Cited

U.S. PATENT DOCUMENTS

| | | | | |
|---|---|---|---|---|
| 5,008,532 A | * | 4/1991 | Ono et al. ............... 250/222.1 |
| 5,285,169 A | * | 2/1994 | Theus ........................ 330/254 |
| 5,994,966 A | | 11/1999 | Stikvoort | |
| 6,278,324 B1 | * | 8/2001 | Hojabri et al. .............. 330/284 |

* cited by examiner

Primary Examiner—George Eckert
Assistant Examiner—Joseph Nguyen
(74) Attorney, Agent, or Firm—Haynes and Boone, LLP

(57) ABSTRACT

A method and apparatus is disclosed for providing highly linear resistance with high sheet values, and for implementing resistors in a conventional CMOS process when either drain or source must operate near the rail of a circuit. Accordingly, a five terminal distributed MOS resistor device includes a drain terminal, a source terminal, and a channel region disposed between the drain terminal and the source terminal. A bulk terminal is adjacent the channel region. A first gate terminal is adjacent the source terminal and a second gate terminal is adjacent the drain terminal. Lastly, a gate region of resistive material is disposed between the first gate terminal and the second gate terminal, wherein upon application of a voltage to the first gate terminal and the second gate terminal, a voltage drop across the gate region is equally distributed along a length of an electrical channel in the channel region.

17 Claims, 17 Drawing Sheets

HIGH SHEET MOS RESISTOR METHOD AND APPARATUS

This application claims the benefits of earlier filed provisional application Ser. No. 60/171,725 filed Dec. 22, 1999.

BACKGROUND

The present invention relates generally to semiconductor devices, and more particularly, to a method and apparatus for providing high sheet resistance in a circuit design using conventional CMOS components.

There are applications in analog integrated circuits which require high resistances, such as an integrated light to voltage converter. A light to voltage converter can be implemented by connecting a photodiode to the summing junction of an operational amplifier with a resistor in the feedback loop. To generate a usable signal with the very small current generated by the photodiode requires a large feedback resistor.

In integrated circuits, resistors are usually constructed using the same layers that are used for the fabrication of the active devices (e.g., transistors) in the circuit. In CMOS circuitry, the layers commonly used for resistors are polysilicon (e.g., used for the gates of MOS devices), diffusion (e.g., used for the source/drain of MOS devices) or N-well (e.g., used to isolate PMOS devices from the P– substrate).

Resistors have conventionally been implemented by defining a geometry (e.g., a rectangle or serpentine structure) in a resistive layer and contacting the two ends of the particular geometry. The value of the resistor is given by the expression:

Resistance=(length/width)*sheet resistance

From the above expression, it follows that the area of a resistor is proportional to its value and inversely proportional the sheet resistance of the resistive material. However, it should be noted that the geometry is limited by the manufacturing process to minimum widths. Accordingly, the width cannot be made arbitrarily small in order to achieve a high resistance. Also, resistors with a minimum width dimension have greater resistance variation due to the manufacturing process width variations. Furthermore, all integrated circuit (IC) resistors have a high frequency loss caused by parasitic capacitance that increases as the length squared of the resistor.

Sheet resistances found in low cost CMOS manufacturing processes are relatively low, which implies that a large value resistor will require a large area. As an example, a one (1) megohm resistor implemented in a one (1) micron CMOS manufacturing process with 50 ohm per square polysilicon will occupy approximately 100,000 square microns. With such a 1 micron CMOS manufacturing process, resistances in the tens of megohms are impractical, or at best, costly.

Accordingly, high sheet resistances in integrated circuits have conventionally entailed additional processing steps. In standard silicon processing, high sheet resistance can usually be achieved by selective doping of polysilicon layers or by the deposition of thin film resistors such as SiCr. Even with these added processing steps, practical sheet resistances for analog circuits are typically limited to 500–2000 ohms per square.

In addition to the above, it is possible to use a MOS transistor operating in the so called "linear" region as a resistor. A technique for using MOS devices in this manner with tightly controlled tolerances was disclosed by Yannis Tsividis in 1982 when he reported on a filter circuit using this technique at the International Solid State Circuits Conference. While this technique achieved relatively high values of resistance, the technique required fully differential circuitry and, furthermore, was not capable of operation at the negative rail. Since that time, a great deal of work has been reported in the literature on MOS resistors in differential circuitry applications.

A method of using PMOS resistors in a single ended (as opposed to a differential configuration) is described in Tsividis, *Six-Terminal MOSFET's: Modeling and Applications in Highly Linear, Electronically Tunable Resistors*, the Journal of Solid State Circuits, January, 1997. Referring now to FIG. 1, a single ended PMOS resistor 10 is shown. For the PMOS resistor, connections are made to the source 12 and drain 14, the source and drain ends of the gate (16,18), and the source and drain ends of the N-well (20,22). The six terminal MOS device can be considered as a infinite number of infinitesimally short devices in series.

In one example, the drain to source voltage (Vds) is sampled and fed back via auxiliary circuitry (not shown) to the gate and well terminals so that the distributed gate and well voltages track the drain to source voltage. In other words, the voltage from nodes Gd to Gs and from Wd to Ws are controlled to be the same as from D to S. In addition, the voltage from node Gs to node S is high enough that the devices operate in the linear region. Equations describing these conditions are:

$$V(Gs)=V(S)+\text{tuning voltage} \tag{1}$$

$$V(Gd)=V(Gs)+V(D)-V(S) \tag{2}$$

$$V(Ws)=V(S) \tag{3}$$

$$V(Wd)=V(D) \tag{4}$$

With respect to the above, the well terminals are not connected to the source and drain terminals directly, but are driven by amplifiers (not shown) buffering the source and drain voltages.

In the configuration of FIG. 1, the gate to source voltage and the source to bulk voltage for each infinitesimal device increases exactly as the drain to source voltage. From classical MOS current equations, it is easily shown that the resistance of the individual elements, and hence the resistance of the entire distributed device, remains constant with increasing Vds.

It is noted that the 6-terminal MOS technique described above can be used to obtain highly linear resistances with high sheet values. However, the configuration is not suitable for implementing resistors in a conventional N-well process when either drain or source must operate at or near the negative rail of the circuit since the voltage at the corresponding gate would have to be below the rail. (The opposite argument holds in a P-well process.) For the configuration of FIG. 1 to work at or near the rail, it would require depletion mode devices. However, depletion mode devices are not available in a standard CMOS process. Accordingly, the 6-terminal MOS resistor is not suitable for single-ended, ground referenced applications.

Turning now to FIGS. 2 and 3, a diode 26 for use in a light to voltage converter 24 implemented in a NMOS process is shown. The light to voltage converter 24 uses an N-well to P– epi/P+ substrate diode 26 for the photodiode. To minimize thermal leakage currents, it is desirable to operate the photodiode 26 of FIG. 2 at zero bias. This is accomplished by connecting the cathode of the diode 26 to the summing junction of an op amp 28 which has the non-inverting input connected to the substrate, such as shown in FIG. 3. Note that the summing junction of the op amp operates at the same potential as the substrate. Accordingly, a 6 terminal PMOS device cannot be used as a feedback resistor 30 for the application of FIG. 3.

A method and apparatus is thus needed for providing highly linear resistance with high sheet values, and for implementing resistors in a conventional CMOS process when either drain or source must operate at or near the rail of a circuit.

SUMMARY

A method and apparatus is disclosed for providing highly linear resistance with high sheet values, and for implementing resistors in a conventional CMOS process when either drain or source must operate at or near the rail of a circuit.

According to one embodiment of the present invention, a five terminal MOS resistive device includes a drain terminal, a source terminal, a singular bulk terminal, a first gate terminal, and a second gate terminal. The first gate terminal is adjacent to the source terminal of the device, and the second gate terminal is adjacent to the drain terminal of the device. Further, the gate terminal is composed of a resistive material so that when a voltage is applied to the first and second gate terminals, a voltage drop across the gate terminal is equally distributed along the length of an electrical channel of the MOS resistive device.

DESCRIPTION OF THE EMBODIMENTS

Figure 4:
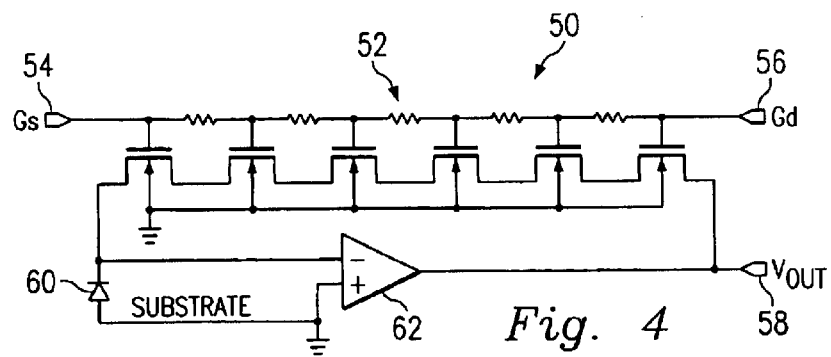
FIG. 4 illustrates a light to voltage converter with a five terminal MOS feedback resistor according to one embodiment of the present invention.

Referring now to FIG. 4, an improved light to voltage converter 50 includes a five terminal MOS feedback resistor 52 according to one embodiment of the present invention. The MOS devices of the five terminal MOS feedback resistor 52 represent an infinite number of infinitesimal devices. The sheet resistance of the MOS resistor is established by controlling the voltages at nodes Gs and Gd (54,56) in a prescribed manner. That is, the control voltage at node Gs (54) is controlled so that when Vout (58) is zero and the voltage at Gs (54) is the same as at Gd (56), the resistance of the MOS resistor 52 is the target value. The voltage difference between the threshold voltage and the voltage at Gs will be referred to herein as Vgst. This voltage difference is typically a few hundred millivolts when high sheet resistances are desired. Illustrative circuits for generating the control voltages for Gs and Gd are described herein below.

When photo current flows through the photodiode 60 to the substrate, the output of the amplifier 62, Vout (58), goes positive. With an non-zero Vout, the infinitesimal MOS devices act as a distributed voltage divider and the gate to source voltage of the devices to the right of the summing junction decreases, increasing the resistance of the devices. In addition, the source to bulk voltage of these infinitesimal devices also increases, causing the threshold voltages of the corresponding devices to increase due to what is commonly referred to as body effect. This body effect causes the resistance of the corresponding device elements to increase still more.

The increase in resistance can be compensated for by making the voltage at Gd equal to V(Gs) plus a scaled value of Vout, according to the following expression:

$$V(Gd)=V(Gs)+K*Vout \qquad (5)$$

where K is a constant. The portion of the resistance increase caused by the decrease in Vgs can be compensated by setting K=1. However, body effect is an additional contributor to the increase in resistance so K must be made greater than 1. By making K greater than 1, the electric field between the gate and channel increases with increasing Vout, causing a decrease in mobility of carriers in the channel and yet another (third order) increase in resistance.

Body effect and mobility modulation are non-linear phenomena and cannot be exactly compensated for by using a constant value of K. However, by properly selecting K, the method of the present embodiments can be used to generate five terminal MOS resistors that have linearity errors well under 1% over a Vds range of zero (0) to over one (1) volt and with sheet resistances in the tens of kilo ohms per square. Accordingly, the sheet resistance obtainable via the method of the present embodiments is more than an order of magnitude higher than is typically obtained with conventional high sheet resistors that require extra processing steps.

Figure 1:
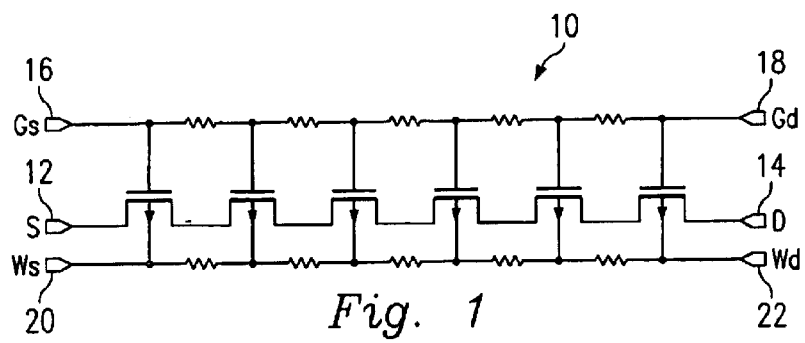
FIG. 1 illustrates a conventional six terminal MOSFET.
Figure 2:
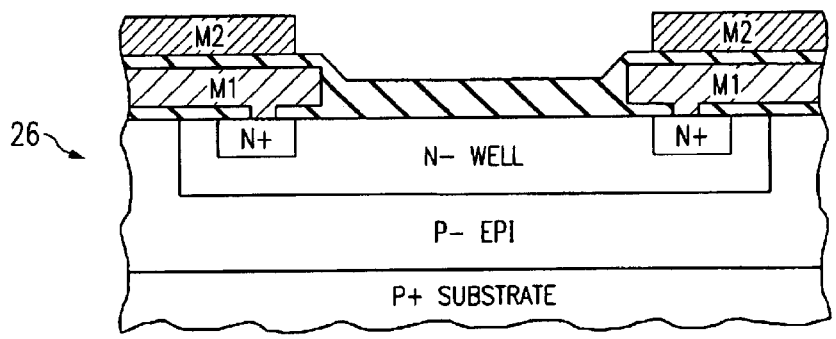
FIG. 2 illustrates a conventional N-well diode.
Figure 3:
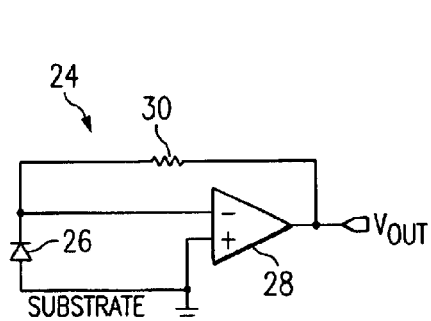
FIG. 3 illustrates a conventional circuit implementing a zero bias light to voltage converter.
Figure 5:
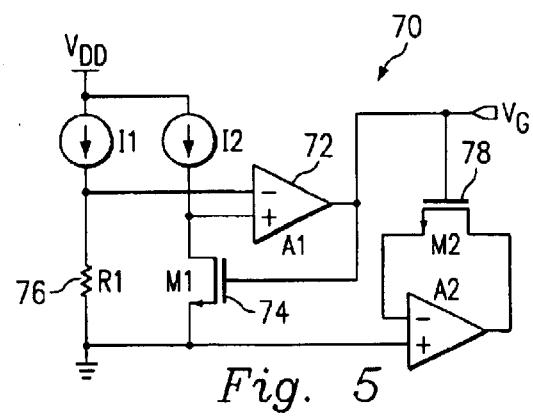
FIG. 5 illustrates a conceptual circuit design for establishing sheet resistance of a MOS resistor.

Referring now to FIG. 5, a tuning circuit 70 establishes a prescribed setting for Vgst and a corresponding sheet resistance for the MOS resistor as follows. The feedback loop forces both inputs of amplifier A1 (72) to be at the same voltage. If this voltage is very small compared to the Vgst of M1 (74), the output resistance Rds of M1 (74) is equal to the value of R1 (76) multiplied by the current ratio I1/I2. Accordingly, it follows that the sheet resistance of M1 is proportional to the sheet resistance of R1. Resistor R1 can be implemented with a conventional resistance material, such as polysilicon. In normal CMOS processing, polysilicon is typically controlled to an initial value of +/−20% and has a predictable temperature coefficient.

By judicious choice of device sizes and current ratios, the sheet resistance of M1 can be set to very high values. On a given CMOS integrated circuit chip, the electrical properties of identical MOS devices will be very similar. The resistance of M2 (78) will be very similar to that of M1 (74), assuming identical geometries and very low Vds.

In the circuit of FIG. 5, the Vds of M1 (74) must be much smaller than Vgst for M1 to be well into the linear region. With a Vgst of a few hundred millivolts, Vds of M1 (74) should be around of 10–20 millivolts at most, which is comparable to the input offset voltages of practical op amps used to implement A1 (72). Accordingly, the circuit of FIG. 5 may not be practical. Offset errors will result in significant errors in the tuned sheet resistance. A circuit which overcomes this problem is shown in FIG. 6.

Figure 6:
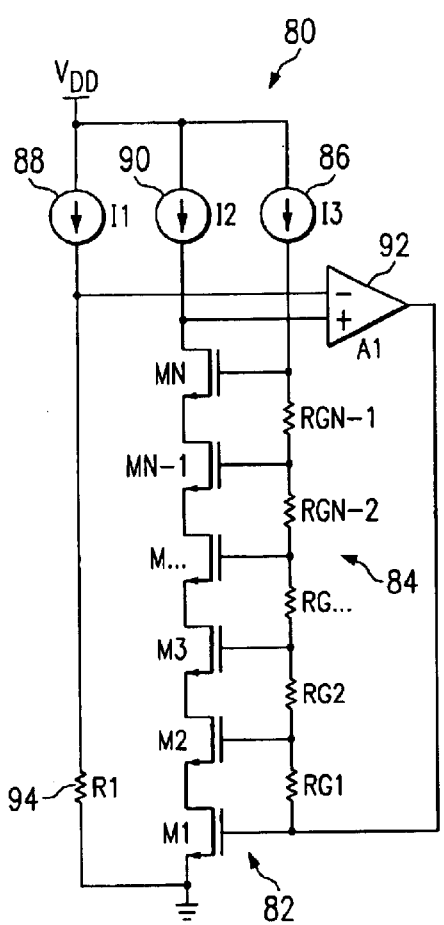
FIG. 6 illustrates a MOS resistor tuning circuit according to one embodiment of the present invention.

FIG. 6 illustrates a MOS resistor tuning circuit 80 according to one embodiment of the present invention. In this tuning circuit, M1 (74) of the previous circuit of FIG. 5 is replaced by the string of MOS devices M1 to MN (as generally indicated by reference number 82 in FIG. 6). The gates of these MOS devices are connected to voltage divider RG1 to RGN-1 (as generally indicated by reference number 84 in FIG. 6). Current source I3 (86) is proportional to current sources I1 (88) and I2 (90) and is scaled such that the Vds of the elements in the MOS string 82 have approximately equal drain to source voltages. (Note that the voltage drops across the resistors RG1 to RGN-1 is greater than the voltage drops across the corresponding MOS devices to compensate for body effect.) In the circuit of FIG. 6, the total voltage drop across the MOS string 82 is much greater than the offset voltage of practical amplifiers that would be used to implement A1 92. Accordingly, the sensitivity to offset errors is effectively eliminated.

The sheet resistance of the MOS resistors tuned by the circuit of FIG. 6 will track the sheet resistance of R1 94. In common CMOS circuits, resistor temperature coefficients range from around 600 ppm per degree C for polysilicon to 6000 ppm per degree C for N-well. Note that with common CMOS circuits, temperature coefficients are positive. According to one embodiment of the present disclosure, it is possible to take advantage of the differences in temperature coefficients to generate a MOS resistor with a flat or even negative temperature coefficient. Achieving a flat or negative temperature coefficient can be done by the addition of a resistor R3 (96) to the tuning circuit of FIG. 6 as shown in FIG. 7.

Figure 7:
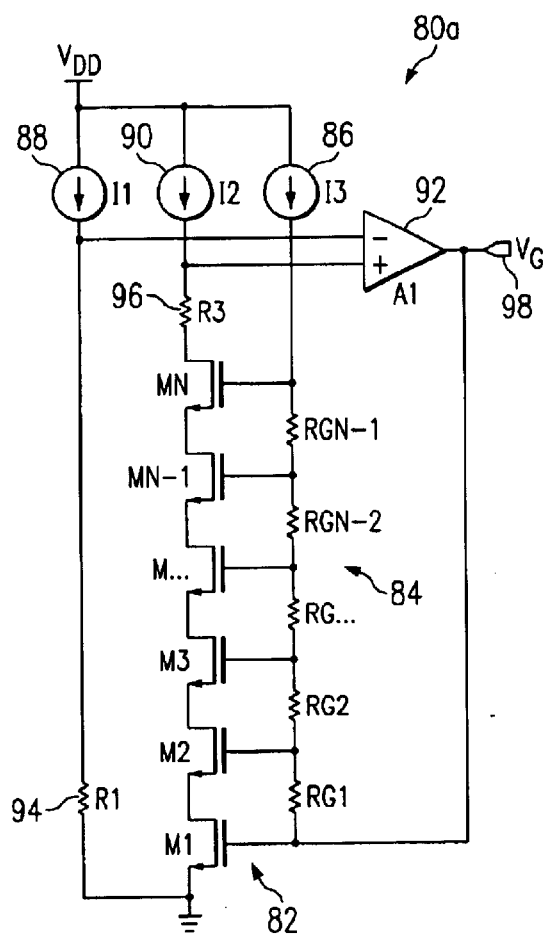
FIG. 7 illustrates a MOS resistor tuning circuit with temperature compensation according to another embodiment of the present invention.

FIG. 7 illustrates a MOS resistor tuning circuit 80a with temperature compensation according to another embodiment of the present invention. In the circuit shown in FIG. 7, R1 (94) is implemented in a relatively low temperature coefficient (600 ppm per degree C) polysilicon while R3 (96) is implemented in a much higher (6,000 ppm per degree C) temperature coefficient N-well resistor. By properly selecting the values of R1 (94) and R3 (96) and the size of the MOS string 82, the temperature coefficient of the tuned MOS resistor can be made significantly lower than that of a standard CMOS polysilicon resistor alone.

Figure 8:
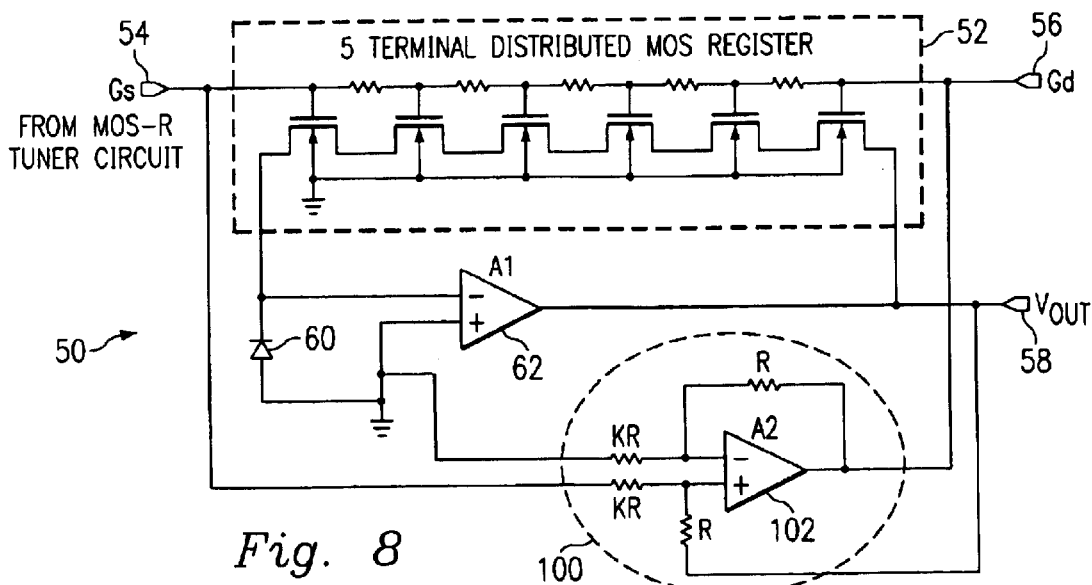
FIG. 8 illustrates another embodiment of a light to voltage converter using five terminal distributed MOS feedback resistor according to the present invention.

Turning now to FIG. 8, the output, Vg (98), of the tuner circuit 80a of FIG. 7 is connected to node Gs (54) of the distributed MOS feedback resistor 52 of the transimpedance amplifier 50. FIG. 8 includes additional circuitry 100 for generating a control voltage for node Gd (56) according to one embodiment of the present disclosure.

We now consider the frequency effects associated with a high value feedback resistor. It is well known to those versed in the art of analog IC design that parasitic capacitances to the substrate and other layers cause a resistor as act as a low pass filter. This is illustrated as follows:

$$R = (L/W)*Rs \quad (6)$$

where R is the resistance of a resistor, L is the length, and W is the width and Rs is the sheet resistance of the material used to implement the resistance. The total parasitic capacitance of a resistor is given by:

$$C = Cp*L*W \quad (7)$$

where Cp is the parasitic capacitance per unit area of the resistor. A first approximation to the bandwidth of a resistor is given by:

$$fc = 2/(R*C*\pi) \quad (8)$$

where fc is the −3 dB cutoff frequency. However:

$$R*C = (L/W)*Rs*L*W*Cp \quad (9)$$

$$R*C = Rs*Cp*L^2 \quad (10)$$

$$fc = 2/(\pi*Rs*Cp*L^2) \quad (11)$$

Accordingly, the cutoff frequency is approximately inversely proportional to the square of the length of the resistor. Note that the cutoff frequency is independent of the width and, hence, the value of the resistor. For very large value resistors implemented in the traditional manner (e.g., on the order of approximately 50 megohms), the cutoff frequency may be as low as several hundred hertz.

Now from expressions (6), (7), (8) and (11), the cutoff frequency can be expressed as:

$$fc = 2*(Rs/Cp)/(R^2*W^2*\pi)$$

The above expression indicates that for a given resistance value R and width W, the bandwidth can be increased only by increasing the ratio of Rs to Cp. In a MOS resistor, the parasitic capacitance is dominated by the gate to channel capacitance. In absolute terms, the gate to channel capacitance is very high as compared to the parasitic capacitance of conventional CMOS resistors (e.g., polysilicon). However, the sheet resistance of a MOS resistor can be made be much higher so that the ratio of Rs to Cp (and hence the bandwidth) can be higher than that of conventional CMOS resistors.

With reference still to FIG. 8, note that since the parasitic capacitance is to the gate of the MOS resistor device 52, the feedback from amplifier A2 (102) provides a distributed bootstrap feedback which has the effect of canceling the parasitic capacitance loss. The bootstrap feedback includes resistors R and KR, where the value of K is selected for providing a desired amount of feedback gain. The bootstrap cancellation is not without cost though, as it boosts the noise of the circuit in the bootstrap frequency region.

Figure 9:
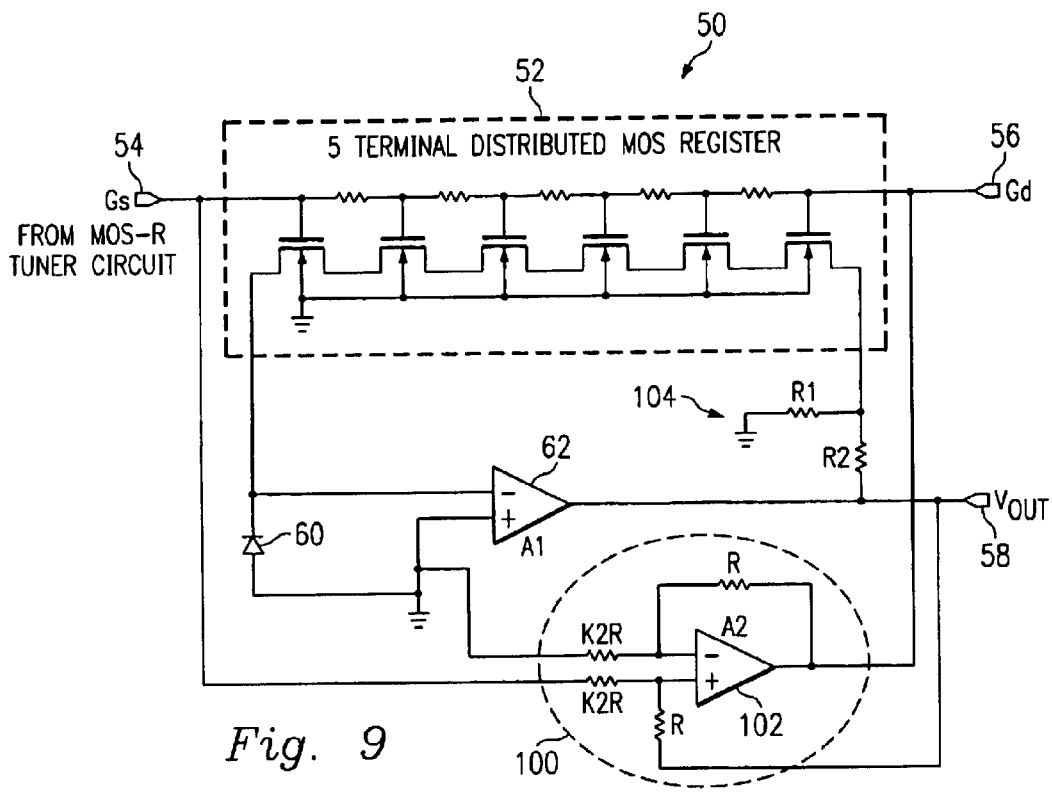
FIG. 9 illustrates a light to voltage converter with a Tee network feedback mechanism according to another embodiment of the present invention.

Even with the area efficiency and higher bandwidth available with the embodiment of FIG. 8, it is sometimes desirable to have an even higher effective resistance. Referring now to FIG. 9, a light to voltage converter integrated circuit includes a Tee network feedback mechanism according to another embodiment of the present disclosure achieves such a higher effective resistance.

In the configuration of FIG. 9, the MOS resistor 52 is driven by a voltage divider 104 connected to the output Vout (58). The 5-terminal distributed MOS feedback resistor 52 is effectively gained by a factor of R1/(R1+R2), assuming that the MOS resistance is much greater than R1 and R2. In addition, the ratio of the resistors in the differential amplifier circuit 100 (i.e., the distributed bootstrap feedback) is adjusted to provide a corresponding proper voltage at Gd (56). Accordingly, the value of K2 is given by the expression:

$$K2 = K*(R1+R2)/R1 \quad (12)$$

An advantage of the circuit of FIG. 9 is that greater values of Vout can be obtained in comparison with the circuit of FIG. 8, with a similar linearity and bandwidth. However, the noise and offset of the amplifier A2 (102) of FIG. 9 is also gained up.

As discussed herein, the circuits (of FIGS. 4, 8, and 9) all have resistors referenced to the negative rail of the circuit. It is possible, using a P-well process, to have a positive rail referenced circuit. It is also possible to have a circuit that is referenced to an intermediate value, which would require having the tuning circuit (of FIGS. 5, 6, and 7) appropriately biased.

According to one embodiment, a method for achieving a very high sheet resistance using standard CMOS components is disclosed. The method enables area efficient high value integrated circuit resistors to be obtained. The present embodiments also provide a method for reducing the effects of high frequency losses caused by parasitic capacitance when the high sheet resistor is used as the feedback element in an amplifier circuit.

According to another embodiment, a five terminal MOS transistor is operated in its linear range as a resistor. The terminals include source, drain, bulk and two gate terminals. The gate terminals are contacted at the source and drain ends of the MOS device. The MOS gate terminal voltages are controlled in a prescribed manner so that the value of the MOS resistance is predictable and repeatable over the operating environment and over process variations. The control voltages also compensate for non-linearities inherent in MOS resistors.

When the MOS resistor of the present embodiments is used as a feedback device in an op amp circuit, high frequency losses due to parasitics are significantly reduced by injecting a signal proportional to the amplifier output into one of the gate terminals, as discussed herein.

Turning now to FIGS. 10–27, a light-to-voltage converter 110 includes a MOS resistor (MOS-R) according to an embodiment of the present disclosure. The integrated circuit 110 of FIG. 10 can be implemented in a much smaller chip with a simpler process that with the prior known techniques. Advantages of the present embodiment includes cost savings and design portability.

Figure 10A:
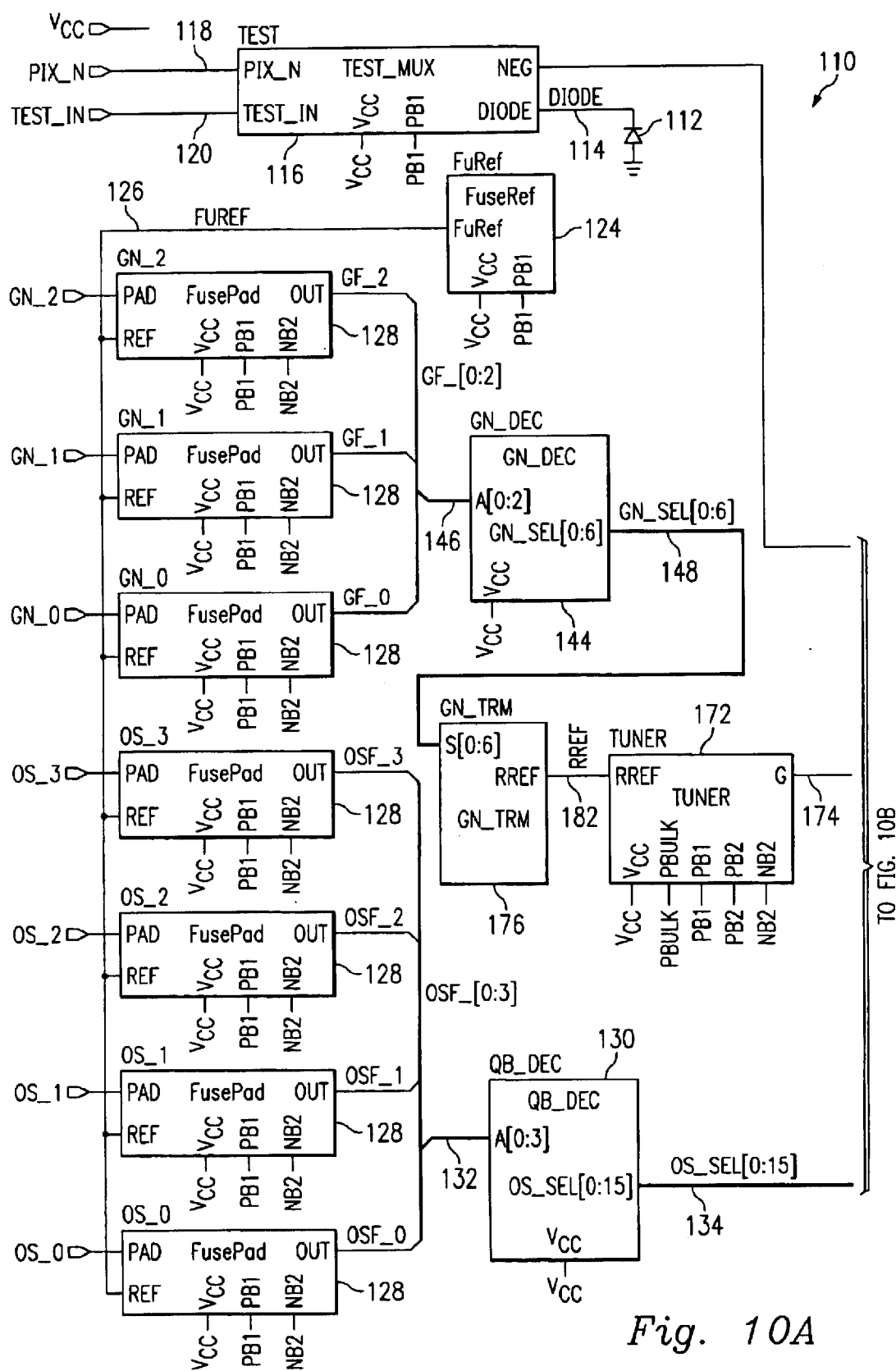
Figure 10B:
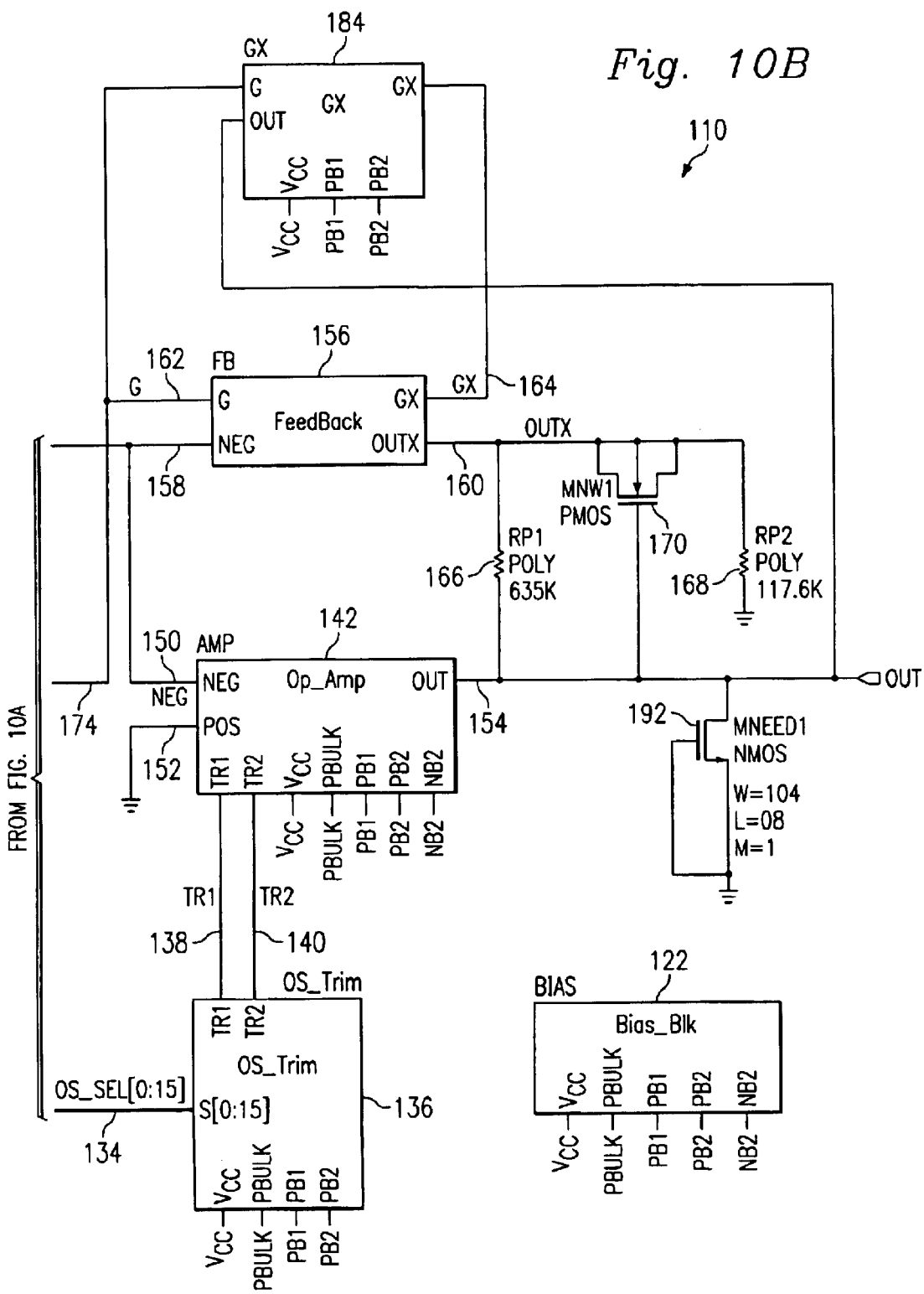

With reference now to FIG. 10, the light to voltage converter 110 includes a photodiode 112 connected to the input of a trans-impedance amplifier. FIG. 10 illustrates a top level schematic for the circuit. In one embodiment, input and output ports on the schematic correspond to pads on an integrated circuit chip. The photodiode 112 is connected to node DIODE (114), further connected to block TEST (116). The various blocks of the circuit of FIG. 10 are discussed below.

Figure 11:
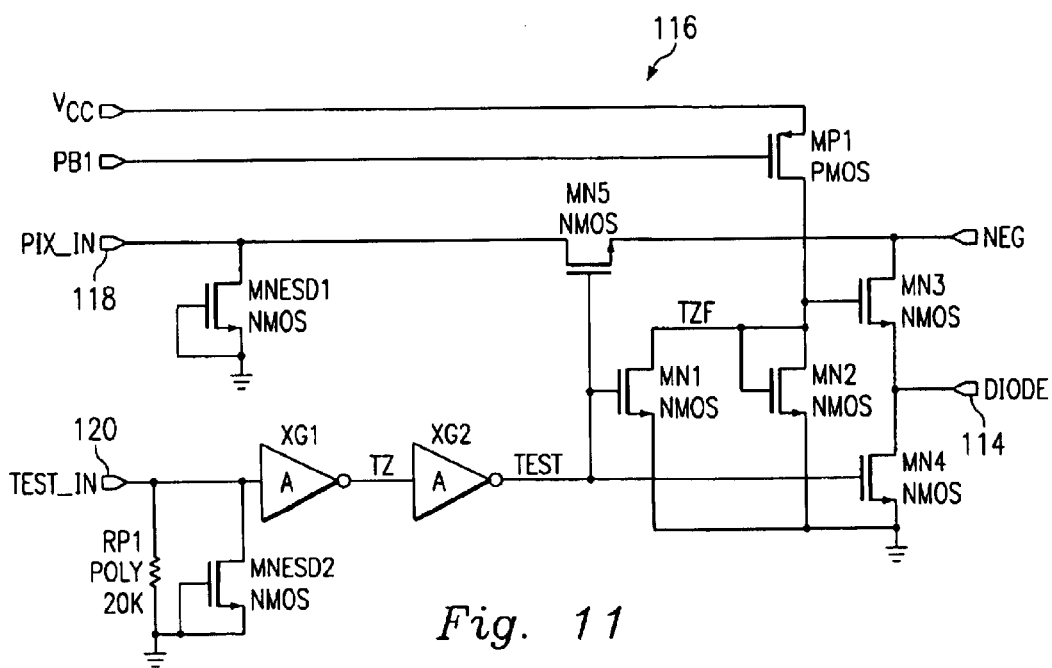
FIGS. 10–27 illustrate circuit schematics for one application of MOS resistors in a MOS resistor tuning circuit according to one embodiment of the present invention.

TEST_MUX 116 is illustrated as instance TEST in FIG. 10 and in greater detail in FIG. 11. TEST_MUX is an analog multiplexer that allows the current input to the trans-impedance amplifier to come from either the photodiode 112 (node DIODE) or from pad PIX_IN (118). Node TEST_IN (120) controls which state the multiplexer is in.

More particularly, with reference now to FIG. 11, the TEST_MUX 116 circuit connects either node PIX_IN or node DIODE to node NEG by way of analog switches MN3 and MN5. When TEST_IN is high, node TEST is HIGH and node TZF is LOW. In this state, MN5 is ON and MN3 is OFF. In normal operation, TEST_IN is LOW, TEST is LOW and TZF is HIGH.

A shunt regulator controls the HIGH level voltage of node TZF. The shunt regulator consists of current source MP1 and diode connected MN2. Accordingly, the voltage at node TZF, a few hundred millivolts above a NMOS threshold, is sufficient to turn MN3 on hard for the expected currents.

Another method of controlling MN3 includes connecting MN3 to node TZ, which is logically the same as node TZF. However, the high level signal at node TZ is connected directly to Vcc. Any variation in Vcc would be capacitively coupled into node NEG through the gate capacitance of MN3. Accordingly, using the shunt regulator to control the high level of node TZF effectively eliminates noise on Vcc from being coupled into node NEG during normal operation.

Except as noted, TEST_MUX block 116 is relatively straightforward in its operation and can be implemented in a number of different ways, using techniques known in the art. Accordingly, FIG. 11 illustrates only one exemplary embodiment of TEST_MUX 116 in greater detail.

Figure 12:
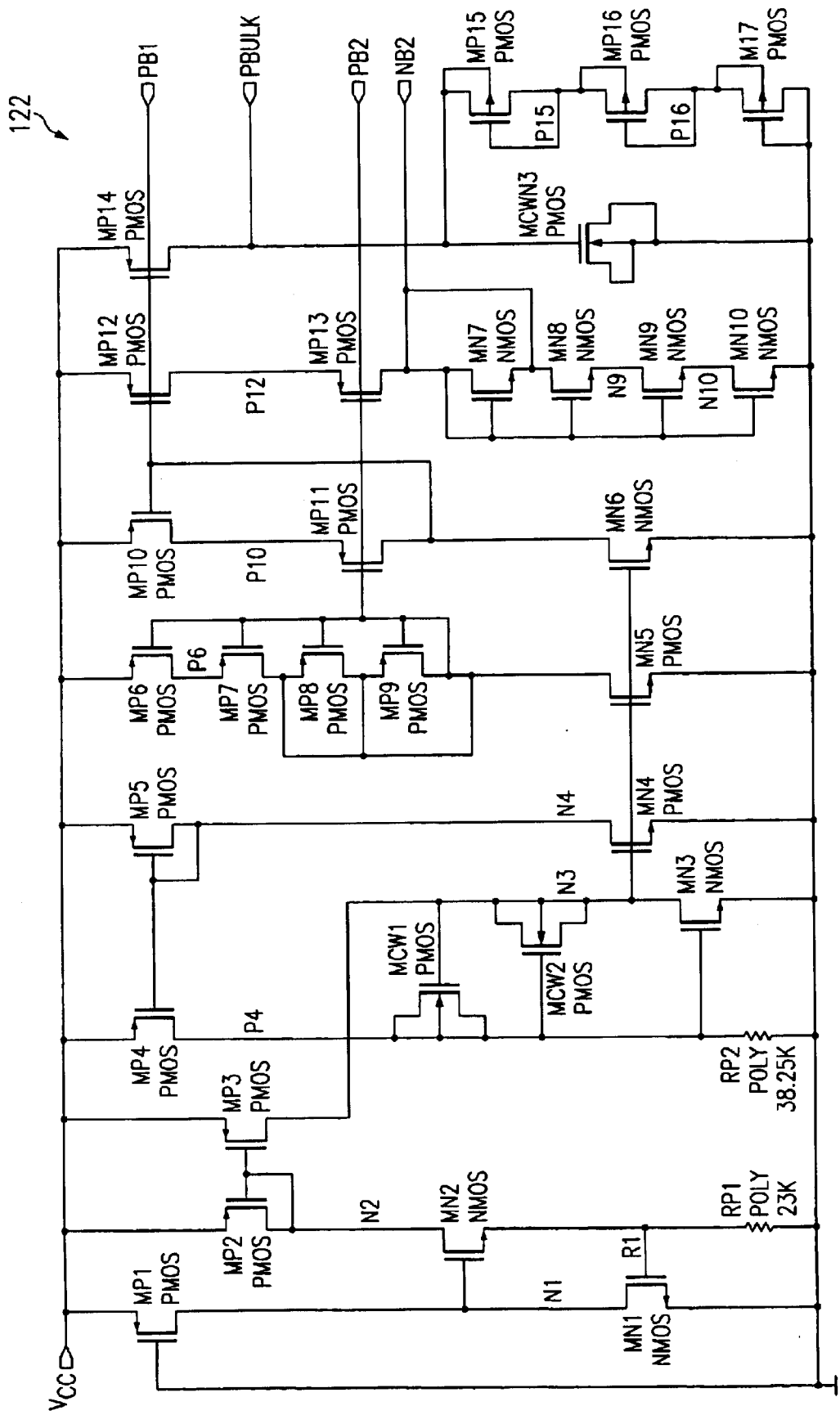

Bias_Blk 122 is illustrated as the instance BIAS in FIG. 10. Bias_Blk 122 includes a circuit block for developing various bias voltages PB1, PB2, NB1 and NB2 for setting currents throughout the integrated circuit device. Bias_Blk 122 also develops voltage Pbulk, a crudely regulated and filtered voltage for biasing the wells of PMOS differential pairs in the inputs of amplifiers for improved power supply rejection. The Bias_Blk block is relatively straightforward in its operation and could be implemented in a number of different ways, using techniques known in the art. FIG. 12 illustrates one exemplary embodiment of Bias_Blk 122 in greater detail.

Figure 13:
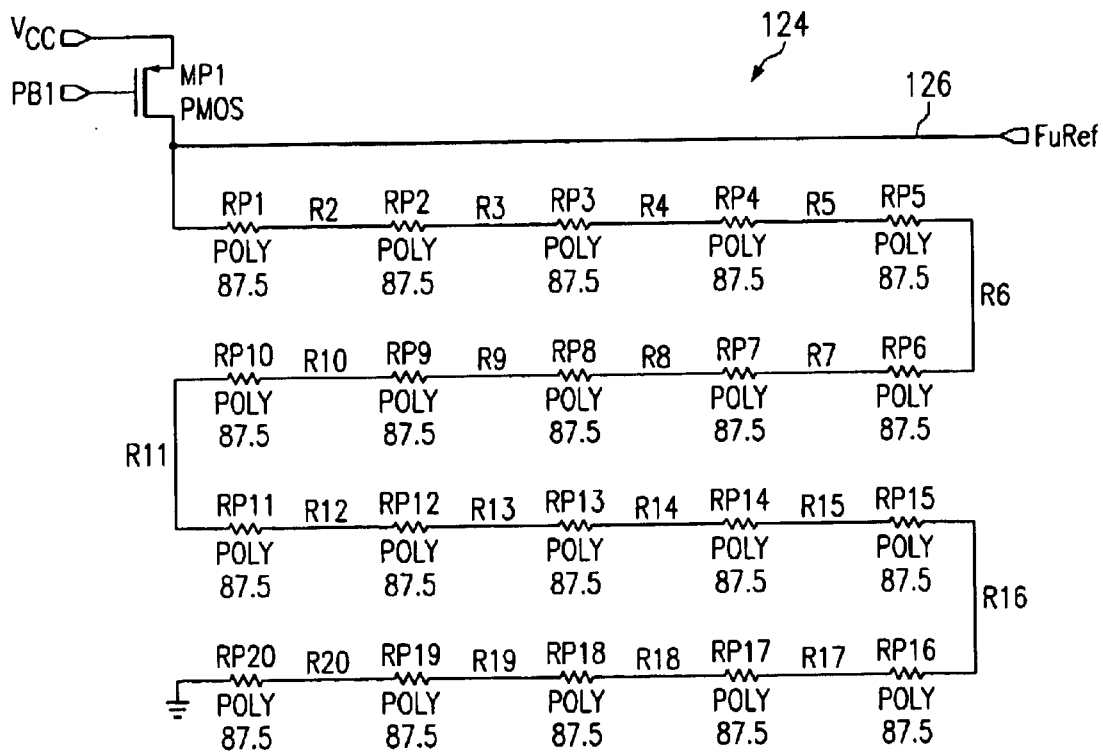

FuseRef 124 is illustrated in FIG. 10 as the instance FuRef. FuseRef 124 includes a circuit block for developing a reference voltage 126 (FUREF) for the FusePad cells 128 of the integrated circuit device 110. The FuseRef block 124 is relatively straightforward and could be implemented in a number of different ways, using techniques known in the art. FIG. 13 illustrates one exemplary embodiment of FuseRef 124 in greater detail.

Figure 14:
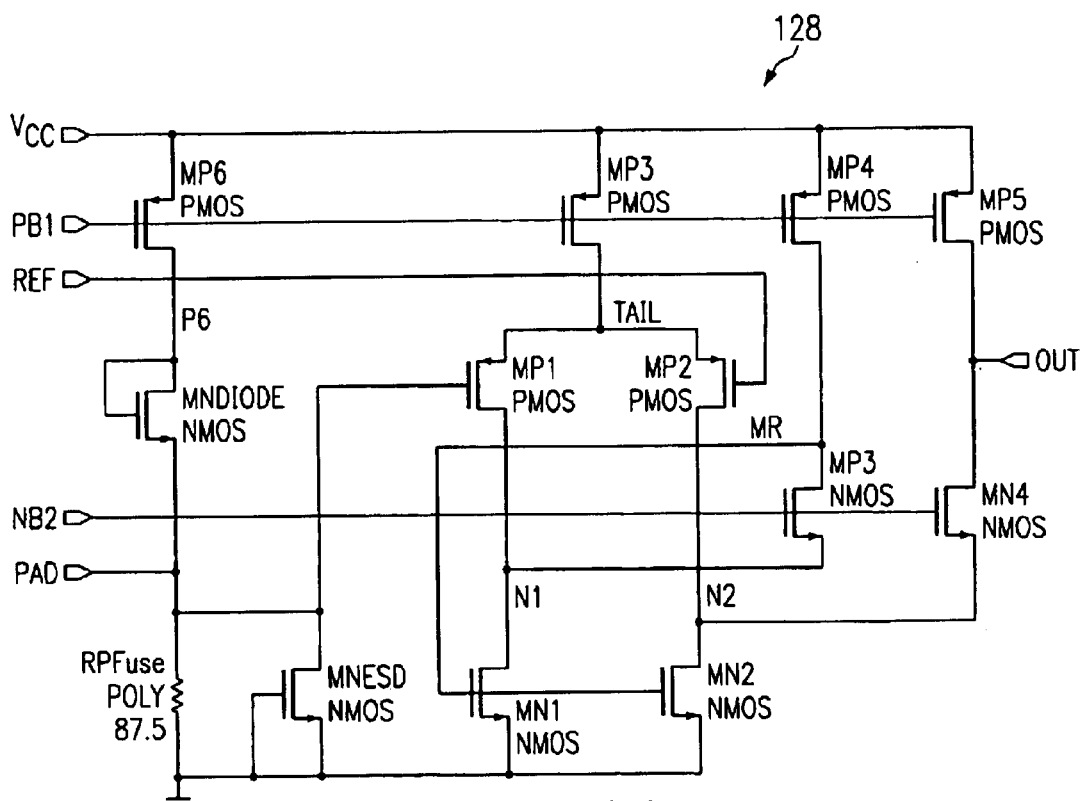

FusePad 128 is illustrated as instances GN_0, GN_1, GN_2 and OS_0 through OS_3 in FIG. 10. Each of the FusePad blocks 128 contains a polysilicon fuse (that may be blown during wafer probe testing, for example) together with suitable circuitry for converting the state of the fuse to a logic one or zero, as appropriate for a given design implementation. The FusePad block 128 is relatively straightforward can be implemented in a number of different ways, using techniques known in the art. FIG. 14 illustrates one exemplary embodiment of FusePad 128 in greater detail.

Figure 15:
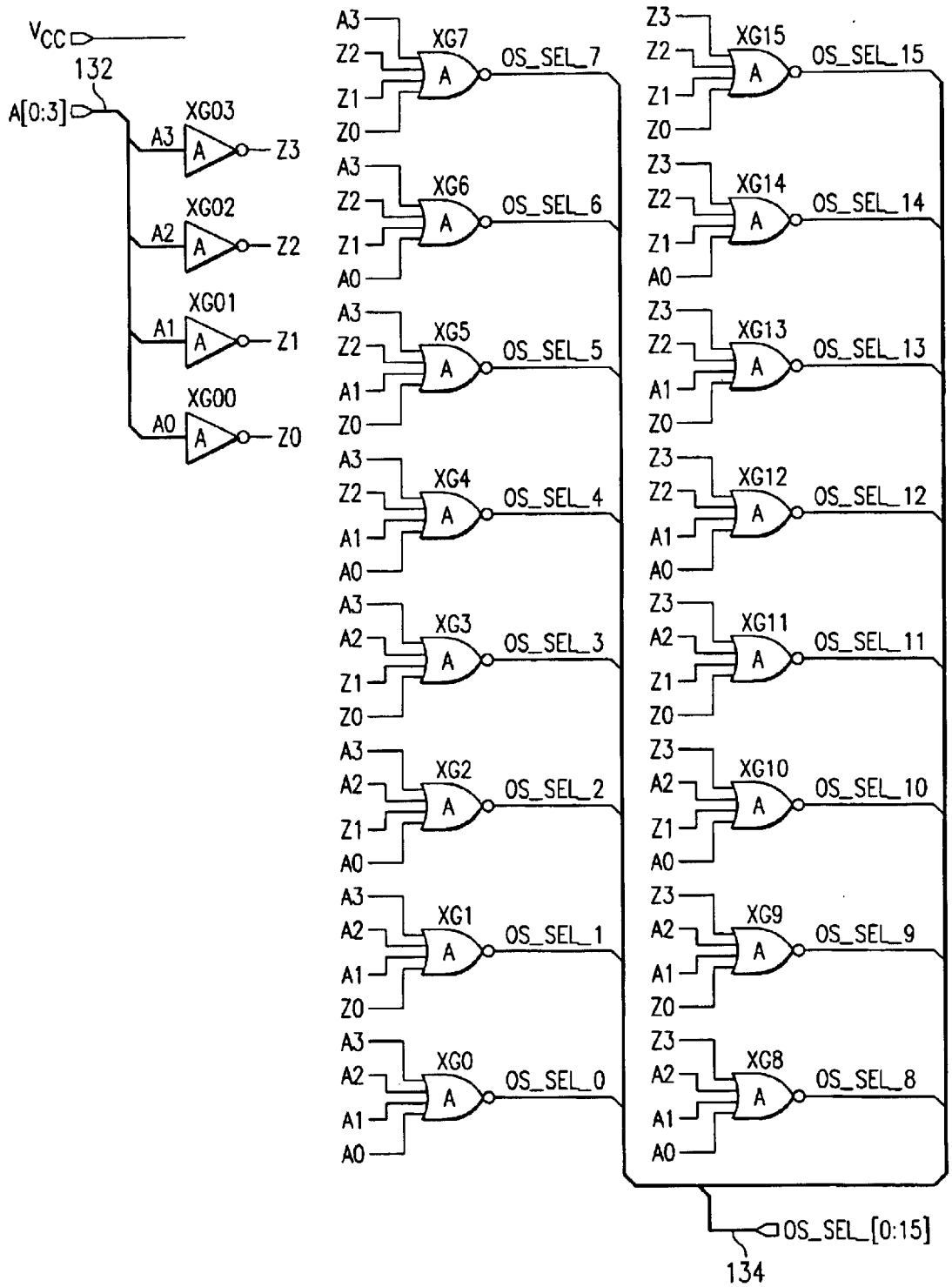

OS_DEC 130 is illustrated as instance OS_DEC of FIG. 10. The OS_DEC 130 includes a CMOS logic circuit for demultiplexing signals OS_[0:3] 132 to signals OS_SEL [0:15] 134. The OS_DEC block 130 is relatively straightforward and can be implemented in a number of different ways, using techniques known in the art. FIG. 15 illustrates one exemplary embodiment of OS_DEC 130 in greater detail.

Figure 16:
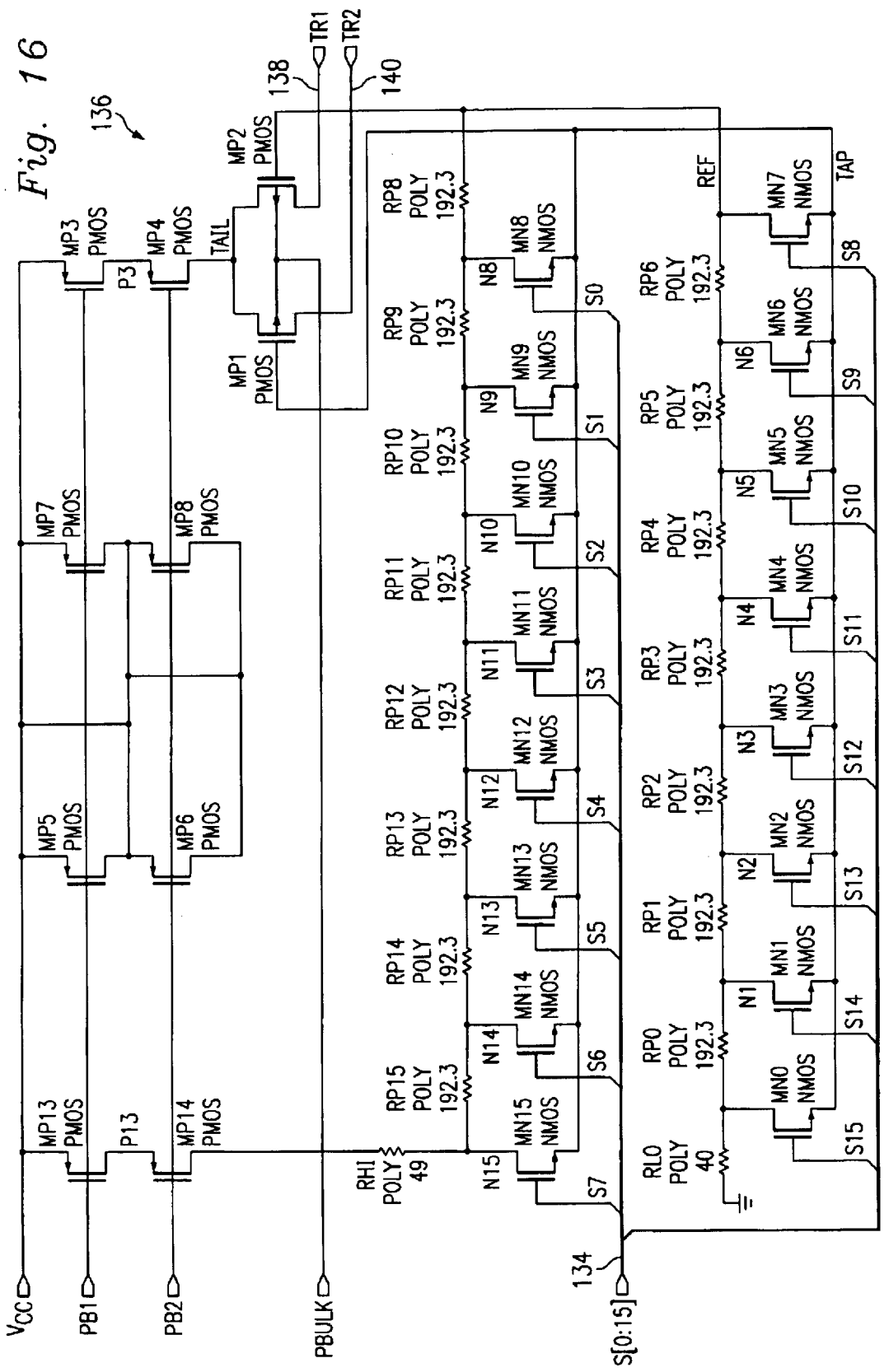

OS_Trim 136 is illustrated as instance OS_Trim in FIG. 10. The OS_Trim block 136 generates current signals TR1 138 and TR2 140 that control the offset of the main op amp 142 (illustrated as instance AMP in FIG. 10). The sum of the current signals TR1 and TR2 is constant, but their relative magnitudes are controlled by signals OS_SEL[0:15] 134. The OS_Trim block 136 is relatively straightforward and can be implemented in a number of different ways using techniques known in the art. FIG. 16 illustrates one exemplary embodiment of OS_Trim 136 in greater detail.

Figure 17:
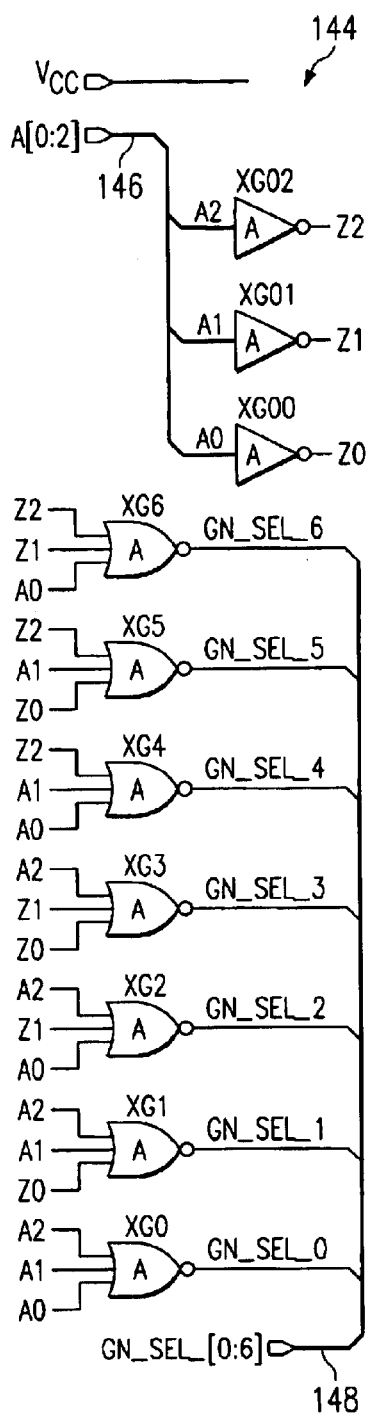

GN_DEC 144, illustrated as instance GN_DEC in FIG. 10, includes a CMOS logic circuit for demultiplexing signals GF_0, GF_1 and GF_2 (146) to signals GN_SEL [0:6] (148). The GN_DEC block 144 is relatively straightforward and can be implemented in a number of different ways, using techniques known in the art. FIG. 17 illustrates one exemplary embodiment of GN_DEC 144 in greater detail.

Figure 18:
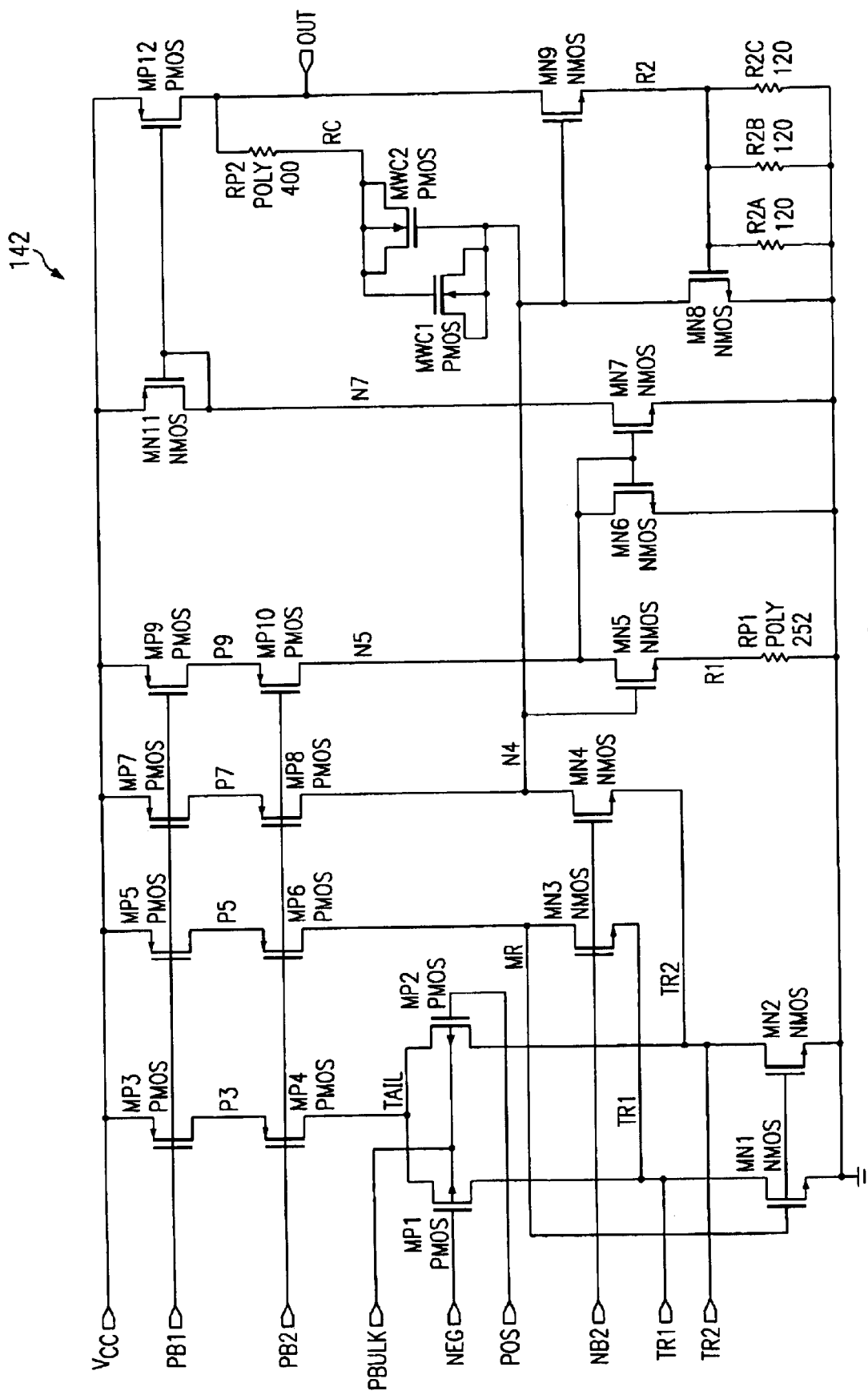

Op_Amp 142, illustrated as instance AMP in FIG. 10, includes a high gain CMOS differential operational op amp with rail to rail outputs and a common mode input range that includes the negative rail (i.e., ground). The inverting input 150 is NEG, the non-inverting input 152 is POS, and the output 154 is OUT. Nodes TR1 (138) and TR2 (140) are connected to block OS_Trim 138, which allows the input offset of the amplifier to be controlled by blowing fuses in instances OS_0 through OS_3. The Op_Amp block 142 is relatively straightforward and can be implemented in a number of different ways, using techniques known in the art. FIG. 18 illustrates one exemplary embodiment of Op_Amp 142 in greater detail.

FeedBack 156, illustrated as instance FB in FIG. 10 (and in further detail in FIG. 19), includes a tuned MOS resistor according to one embodiment of the present disclosure. The tuned MOS resistor nodes include NEG (158) and OUTX (160). The voltages on the control nodes, G (162) and GHI (164), control the resistance value of the MOS resistor. Further details of the FeedBack block 156 will be described further herein below.

In FIG. 10, resistors, RP1 (166) and RP2 (168), are polysilicon resistors. Resistors RP1 and RP2 form a Tee network to effectively multiply the value of the MOS feedback resistor 156 by a prescribed factor, for example, on the order of approximately 6.4. In addition, the MOS device, MNW1 (170), of FIG. 10 is used as a capacitor for controlling the frequency response of the Tee network of RP1 and RP2.

Tuner 172, illustrated as instance Tuner in FIG. 10 (and in further detail in FIG. 20), generates a voltage G (174) which controls the resistance of the MOS resistor in block FeedBack 156 such that the MOS resistor is proportional to a reference resistance in block GN_TRIM 176. The Tuner block 172 is used in accordance with an embodiment of the present disclosure. Details of the Tuner block 172 will be described further herein below.

GN_TRIM 176, illustrated as instance GN_TRIM in FIG. 10 (and in further detail in FIG. 21), provides a resistance 178 between block TUNER 172 and ground. The resistance is selected by signals GN_SEL[0:6] 148. GN_TRIM 176 is used in accordance with an embodiment of the present disclosure. Details of the GN TRIM block 176 will be described below.

Figure 21:
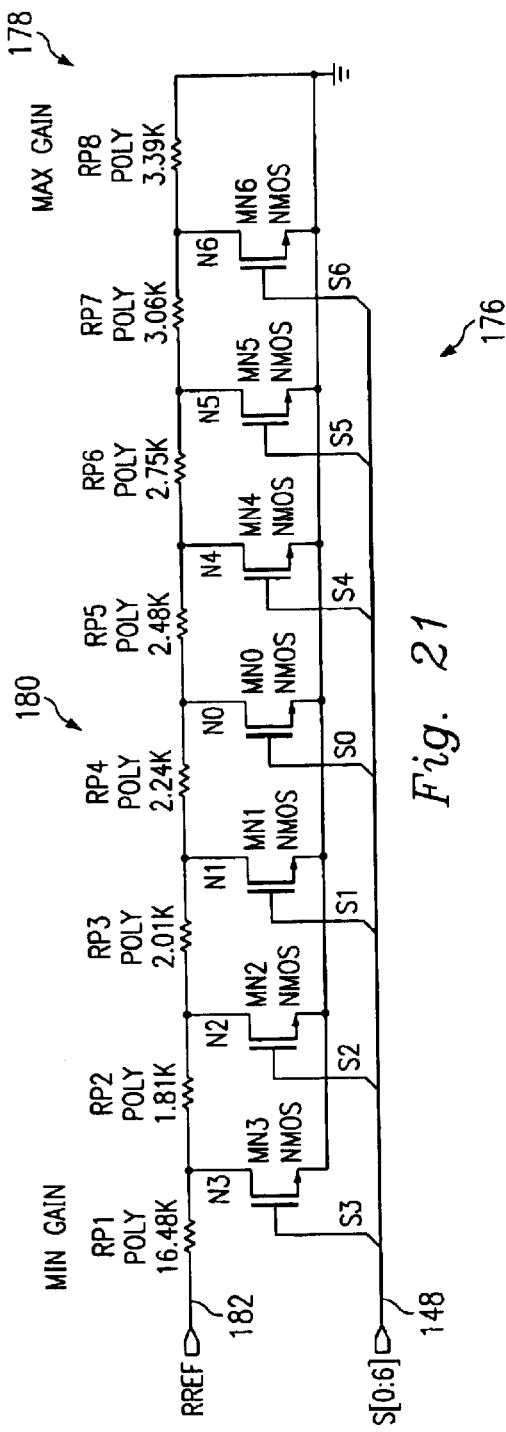

Gn_Trim Details: Referring now to FIG. 21, Gn_Trim includes a series string of polysilicon resistors 180 connected between node RREF 182 and ground. The taps of the resistor string can be shorted to ground by turning on the MOS device connected to a corresponding tap, thereby digitally controlling the resistance 178 between node RREF 182 and ground. The value of the resistance 178 to ground as seen at node RREF controls the value of the tuned MOS resistance. For example, the value of the resistance string 180 can be nominally trimmed, for example, to 22.5K at wafer probe by setting the appropriate fuses.

GX 184, illustrated as instance GX in FIG. 10 (and in further detail in FIG. 22), sums the voltage G 174 with a voltage proportional to the output 154 of AMP 142 to generate a control voltage GX 164. The control voltage 164 is used to assure the tuned MOS resistor in block FeedBack 156 is essentially constant as the voltage across the MOS resistor varies. Details of the GX block 184 will be described below.

Figure 22:
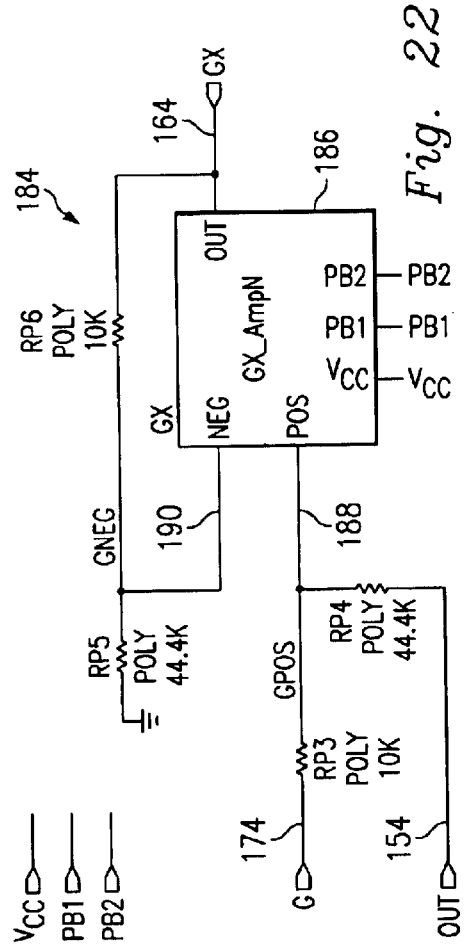
Figure 23:
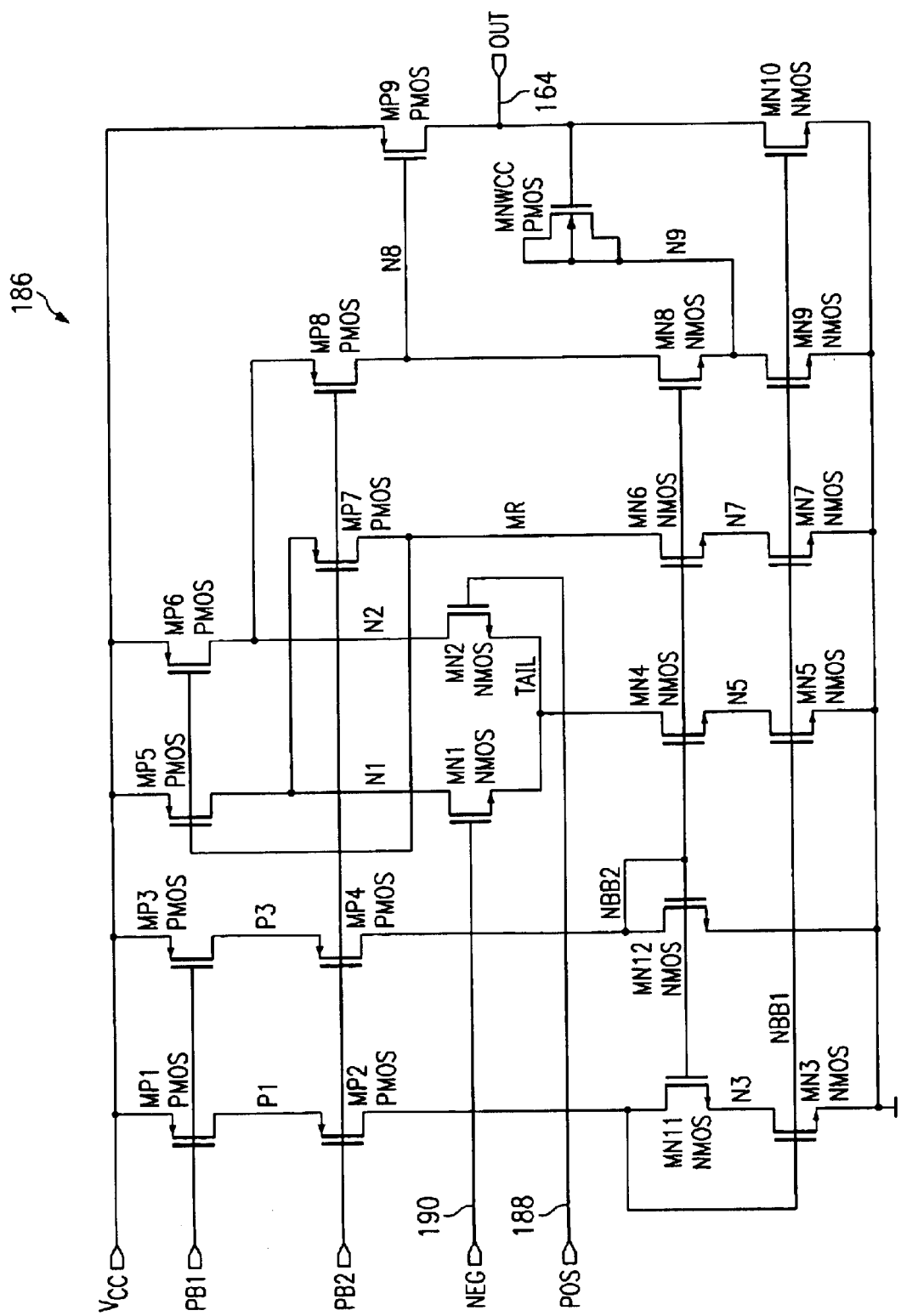
Figure 24:
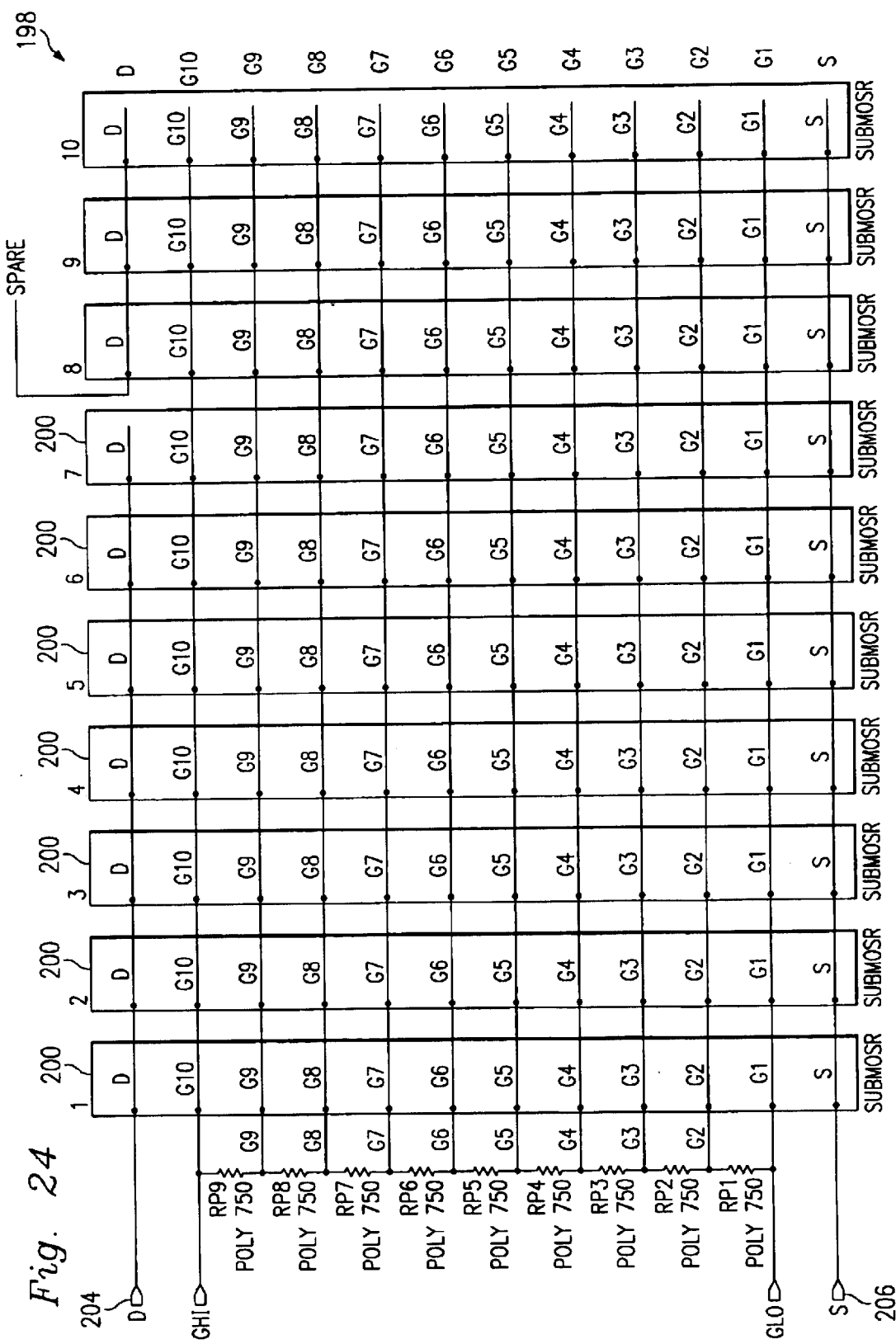
Figure 25:
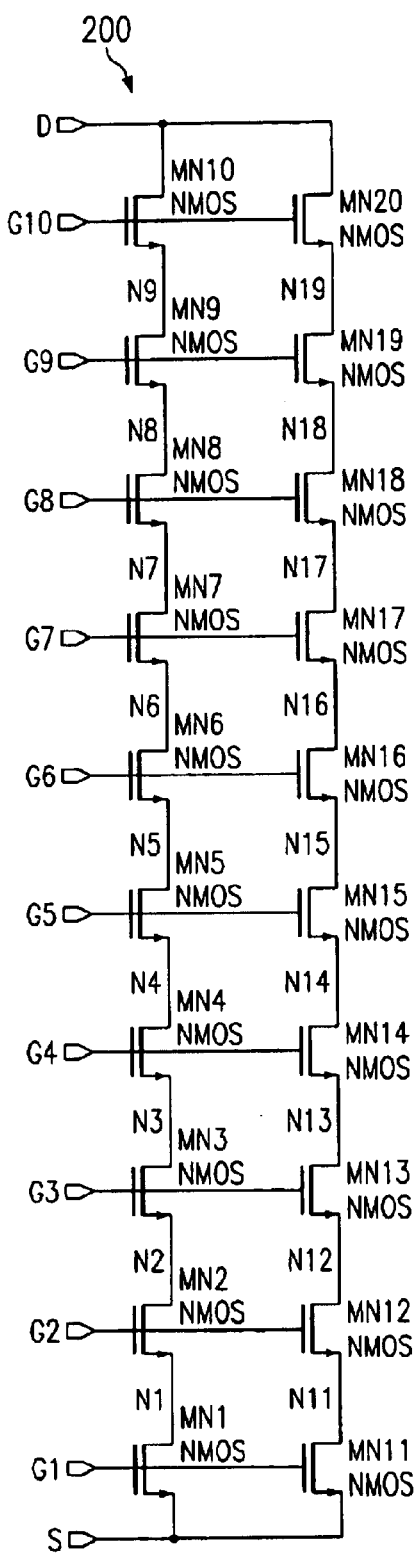
Figure 27:
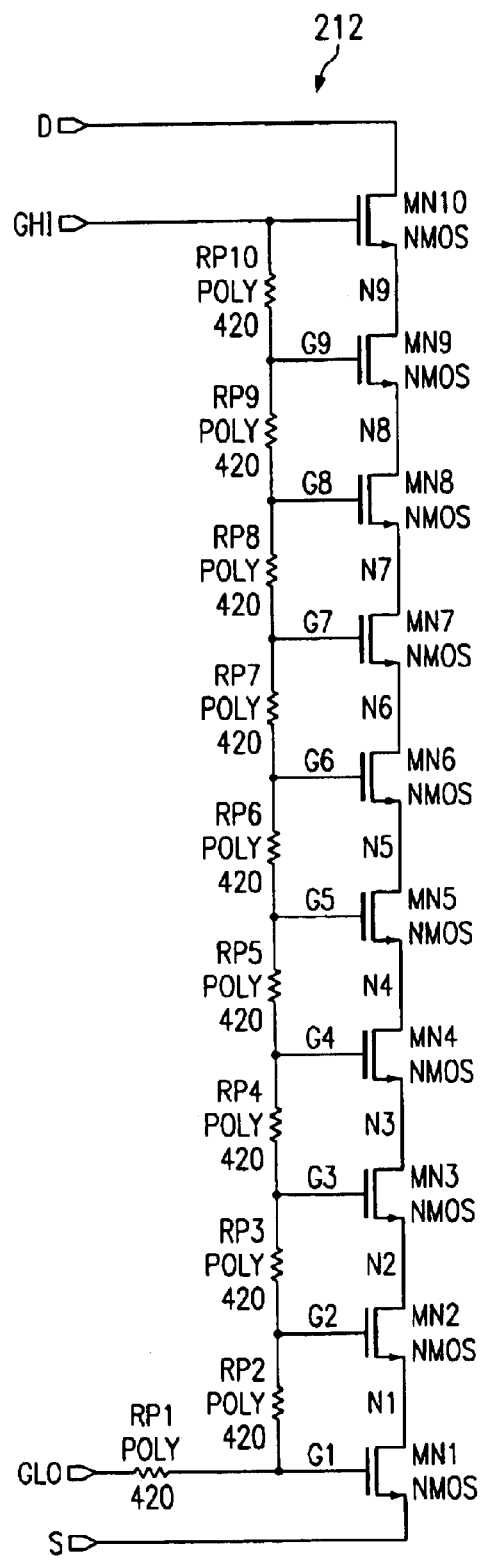

GX Details: Turning now to FIG. 22, sub-block GX_AmpN 186 includes a differential operational amplifier with non-inverting input POS 188 and inverting input NEG 190. The GX_AmpN block 186 is relatively straightforward and can be implemented in a number of different ways, using techniques known in the art. One exemplary embodiment of GX_AmpN 186 is shown in FIG. 23. A loop analysis of the circuit of FIG. 22 indicates that the voltage at node GX 164 is simply the voltage at node G 174 plus 0.225 times the voltage at node OUT 154. Note from the schematic of FIG. 10, however, that the voltage at node OUT 154 is 6.4 times the voltage at node OUTX 160. Accordingly, the voltage at node GX 164 is 1.44 times the voltage at node OUTX 160 plus the voltage at node G 174.

The NMOS device 192, illustrated as instance MNESD1 in FIG. 10, is used for electrostatic discharge protection. The device MNESD1 192 is not relevant to the electrical operation of the light to voltage converter circuit 110.

Figure 20:
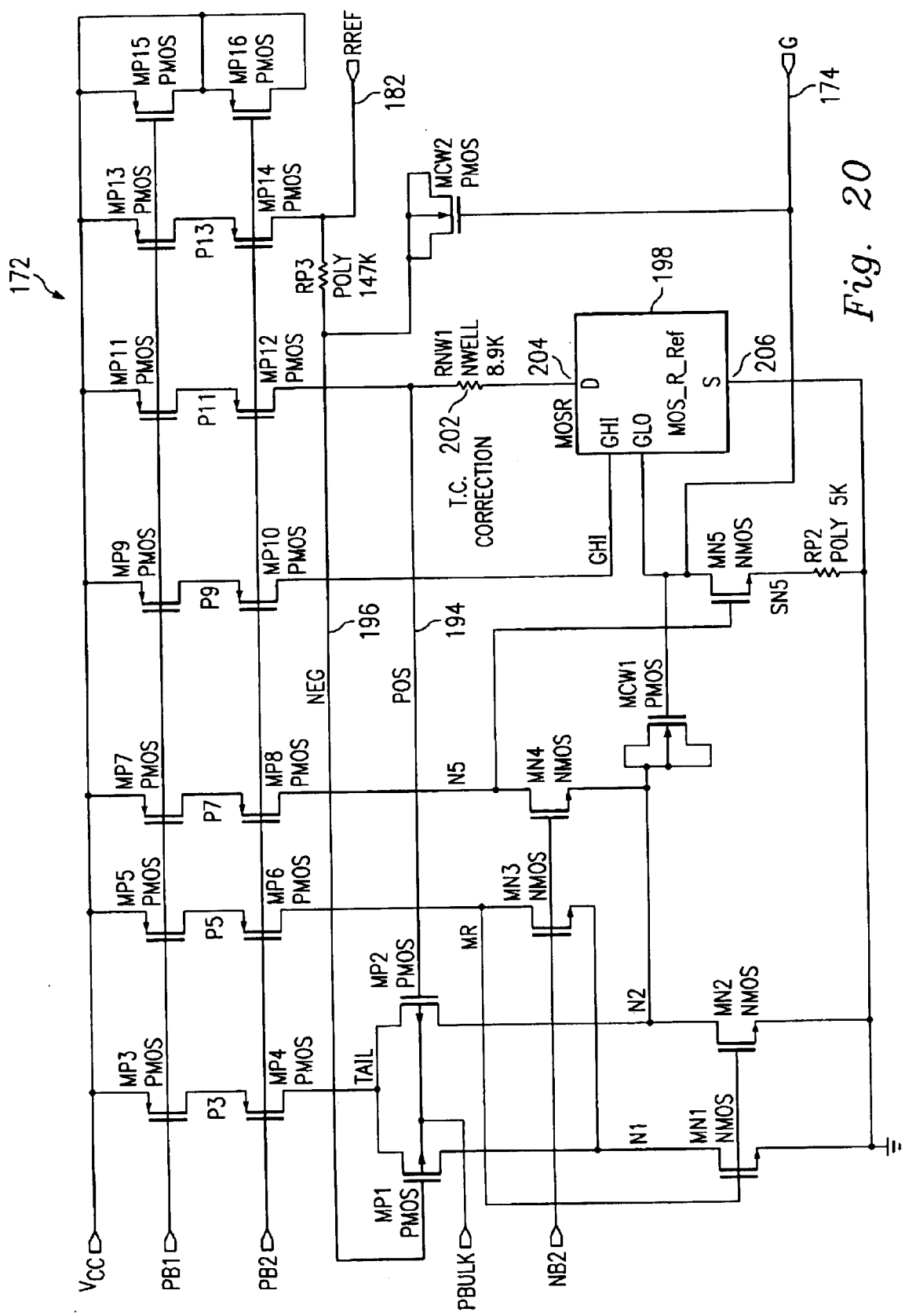

TUNER Details: Referring now to FIG. 20, devices MP1–MP8, MN1–MN5, resistor RP2 and compensation capacitor device MCW1 of Tuner 172 comprise a two stage folded cascode operational amplifier with non-inverting input POS 194, inverting input NEG 196 and an output G 174. Note that the particular op amp topology as illustrated is only one of many that could be used.

Devices MP9/10, MP11/12 and MP13/14 are matched constant current sources with currents of 52X, 2X and 8X respectively, where X is approximately 2 microamperes. As shown, devices MP15/MP16 of FIG. 20 are spare devices.

Block MOS_R_REF 198, illustrated as instance MOSR in FIG. 20, is a rectangular matrix of NMOS devices with the gates of the devices in each row connected together and the sources and drains of the devices in each column connected. In addition, resistors connect between the parallel gates of each row such that the resistors form a series string. Finally, the drains of the devices in the top row are connected as are the sources of the bottom row. The gates in the top row are connected to node GHI, the gates in the bottom row are connected to node GLO, the drains in the top row are connected to node D and the sources in the bottom row are connected to node S. Refer also to the schematics MOS_R_Ref 198 of FIG. 24 and SubMOSR of FIG. 25. Devices RP3 and MCW2 provide loop feedback stability for Tuner 172 of FIG. 20.

Operation of the TUNER block 172 of FIG. 20 is as follows:

Node RREF 182 is connected to a nominal 22.5K ohm resistance to ground in block GN_TRIM 176 (FIGS. 10 and 21). The current from MP13/14 in FIG. 20 establishes a reference voltage at node RREF 182 of approximately 350 millivolts. This voltage is sufficiently high that input offsets of the op amp do not cause significant errors.

Current source MP11/12 of FIG. 20 forces a constant current through the series connected resistor RNW1 202 and into the drain node (D) 204 of the MOS_R_Ref block 198. The source node (S) 206 of the MOS_R_Ref block 198 is connected to ground.

Current source MP9/10 of FIG. 20 forces a constant current through the series resistor string connected internally in block MOS_R_Ref 198 between nodes GHI and G. Accordingly, a constant voltage drop results between nodes GHI and G. In addition, the voltage drop is designed to keep the devices in the MOS matrix of MOS_R_Ref 198 in the linear region of operation with a relative constant drain-source voltage.

The resistance of the MOS_R_Ref block 198, and hence the voltage at node POS 194, will be determined by the voltages at nodes G and GHI. If the voltage at node POS 194 is higher than the voltage at node RREF 182 (node NEG 196 for DC purposes) the voltage at node G 174 will increase, causing the drain-source resistance of the MOS devices in the MOS_R_Ref block 198 to decrease until the voltages at RREF 182 and POS 194 are matched. In other words, this is a closed loop with negative feedback. Since the voltages at nodes RREF 182 and POS 194 are the same and the currents from sources MP11/12 and MP13/14 are precisely ratioed, it follows that the resistance of RNW1 202 in series with MOSR 198 is also precisely ratioed. With the values as shown in FIG. 20, the effective drain to source resistance of block MOSR 198 is 81.1K ohms.

Now, consider that the nominal 22.5K ohm polysilicon reference resistor has a positive temperature coefficient of about 700 PPM per degree C. Resistor RNW1 202 is composed of N-well material, which has a positive temperature coefficient of about 7000 PPM per degree C. As temperature of the circuit rises, the increase in the reference resistance will be proportionately matched in the RNW1/MOSR string primarily by the increase in RNW1. As a result, the MOSR resistance will be approximately constant over temperature.

FeedBack Details: Referring again to FIG. 19, according to one embodiment, the MOS devices of FeedBack block 156 include dimensions on the order of 120 microns long and 0.8 microns wide. A contact is made to the gate at each end of the feedback device. Accordingly, there is a continuous resistance from the drain end of the gate 164 to the source end of the gate 162.

Figure 26:
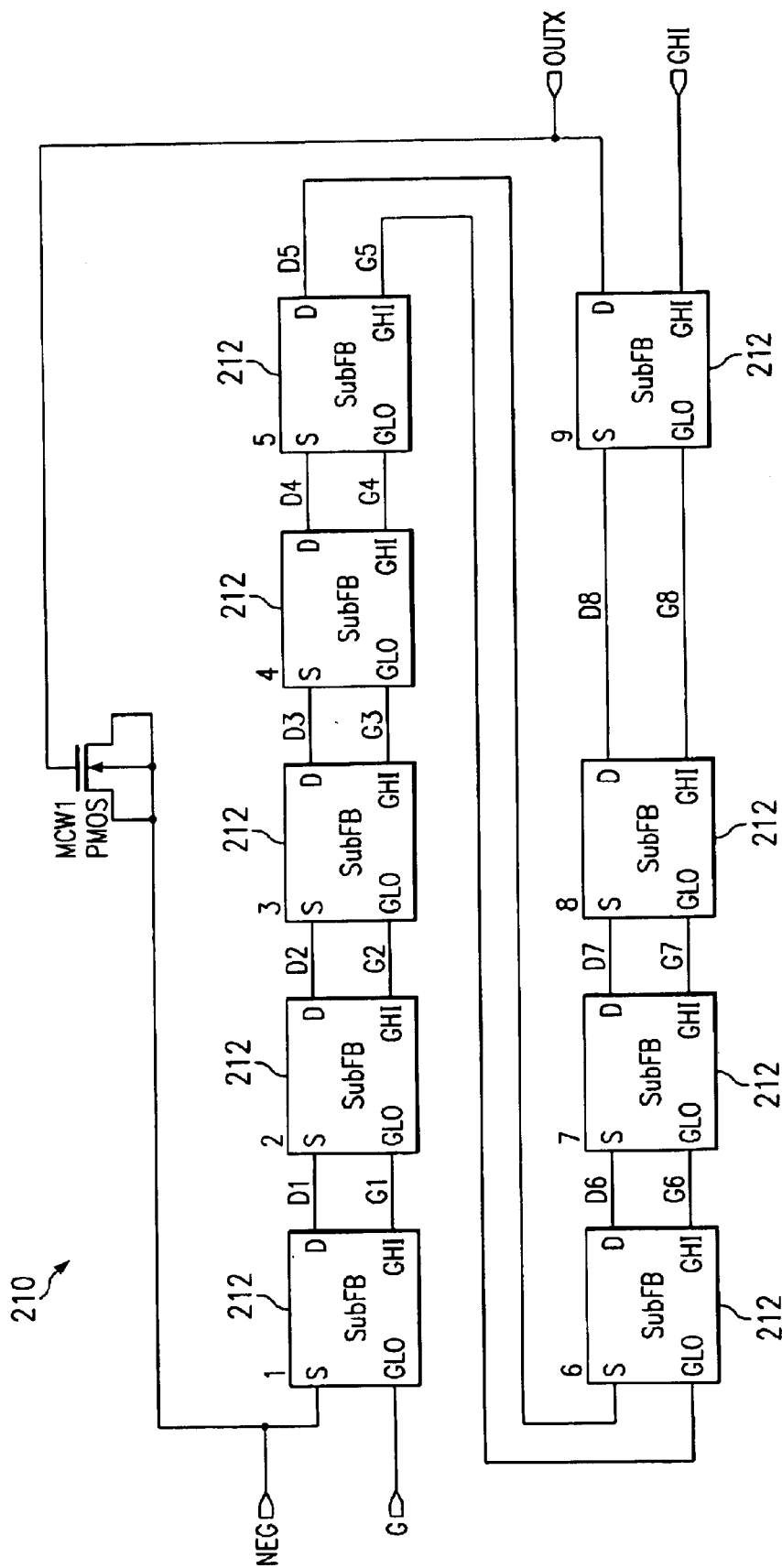

An approximation of the feedback network of FeedBack block 156 can be given by block FeedBack_Sim 210 as shown in FIG. 26. The FeedBack_Sim block 210 represents each device as ten (10) smaller devices, including SubFB 212 of FIG. 27. In one embodiment, this approximation was used in a simulation and provides a reasonably accurate representation of the actual electrical performance of the device.

Figure 19:
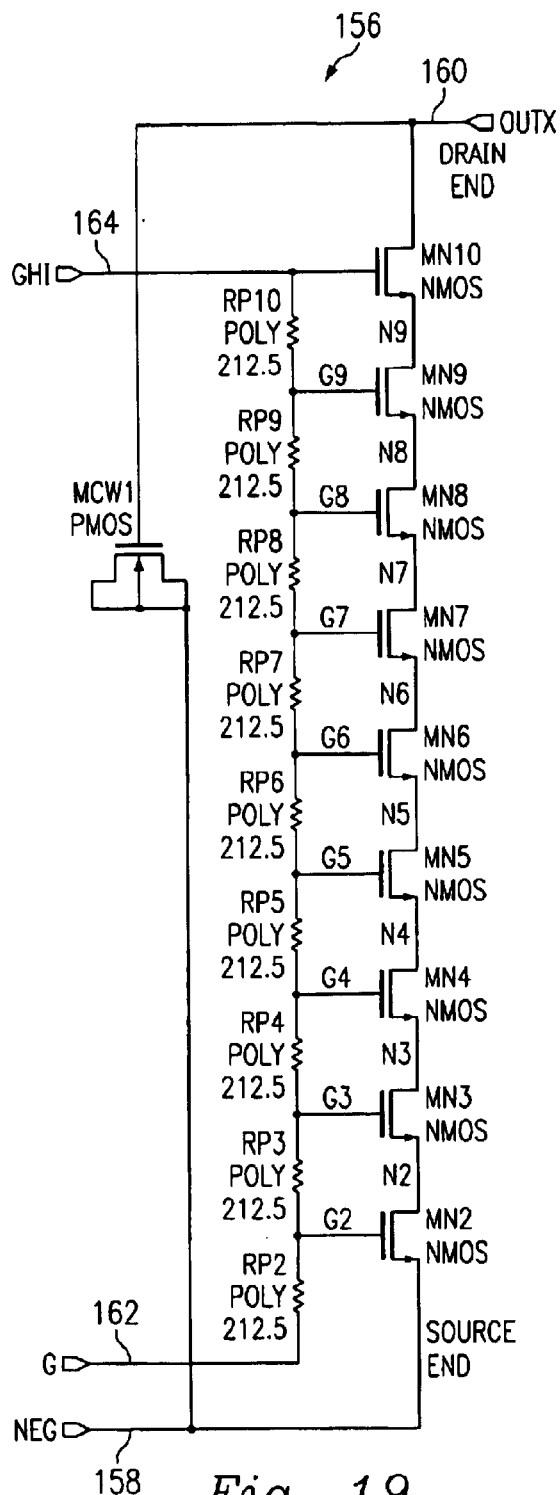

In the FeedBack block 156 of FIGS. 10 and 19, nodes OUTX 160 and NEG 158 are the terminals of a tuned MOS-R resistor. Nodes G 162 and GX 164 are connected to control voltages. Node NEG 158 is close to zero volts. Also, as noted above in connection with the GX block 184 details, the voltage at node GX 164 is equal to the voltage at G 174 plus 1.44 times the voltage at node OUTX 160.

With no current through the MOS-R resistor of FeedBack 156, the voltage at G 162 is the same as at GX 164. In this condition, the resistance of the MOS-R resistor is proportional to the resistance 198 of the MOS_R_REF resistance in the TUNER block 172 (FIG. 20).

When current flows through the MOS-R resistor the voltage at OUTX 160 increases. According to simple MOS equations, increasing the drain voltage of a MOS device in the linear range of operation causes the drain-source resistance to increase. As the voltage increases, the threshold voltage along the channel of the distributed device also increases due to body effect, causing a further increase in the drain-source resistance. These source-drain resistance changes, and also some resistance changes due to carrier velocity saturation, can be largely eliminated by controlling the distributed gate voltage appropriately. According to one embodiment, it has been found that for a particular CMOS process used, a factor of 1.44 is optimum for the first order correction circuit. With different doping profiles and oxide thickness, it is expected that the factor may be slightly different. It has also been found that the linearity error was typically less than 0.5% over the desired operating range.

In addition to the above, a parasitic capacitance is noted between the channel of the device and the gate and substrate which causes a high frequency loss. Summing the output signal at node GX 164 provides a high frequency bootstrap effect, which significantly extends the high frequency range of operation of the circuit.

The above disclosure provides many different embodiments, or examples, for implementing different features of the invention. Techniques and requirements that are only specific to certain embodiments may be imported into other embodiments. Also, specific examples of components, and processes are described to help clarify the invention. These are, of course, merely examples and are not intended to limit the invention from that described in the claims.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims. In the claims, means-plus-function clauses are intended to cover the structures described herein as performing the recited function and not only structural equivalents, but also equivalent structures.

What is claimed is:

1. A transimpedance amplifier integrated circuit comprising:

an amplifier having an inverting input, a non-inverting input, and an output; and a distributed MOS resistor device coupled between the inverting input and the output of said amplifier, wherein the distributed MOS resistor device includes a drain terminal, a source terminal, a channel region disposed between the drain terminal and the source terminal, a first gate terminal adjacent the source terminal, a second gate terminal adjacent the drain terminal, and a series of resistive devices intermittently connected to a gate region between the first gate terminal and the second gate terminal, wherein upon application of a voltage to the first gate terminal and the second gate terminal, a voltage drop across the gate region is distributed along a length of the channel region, to thereby provide a linearly controlled resistance between the inverting input and the output of the amplifier.

2. A transimpedance amplifier integrated circuit comprising:

an amplifier having an inverting input, a non-inverting input, and an output;

a distributed MOS resistor device coupled between the inverting input and the output of said amplifier, wherein the distributed MOS resistor device includes a distributed MOS resistor device having only five terminals, including a drain terminal, a source terminal, a channel region disposed between the drain terminal and the source terminal, a singular bulk terminal adjacent the channel region, a first gate terminal adjacent the source terminal of the five terminal distributed MOS resistor device, a second gate terminal adjacent the drain terminal of the five terminal distributed MOS resistor device, and a gate region of resistive material disposed between the first gate terminal and the second gate terminal, wherein upon application of a voltage to the first gate terminal and the second gate terminal, a voltage drop across the gate region is equally distributed along a length of an electrical channel in the channel region, the first gate terminal for being coupled to a first signal and the second gate terminal for being coupled to a second signal; and a photodiode coupled between the non-inverting input and the inverting input of said amplifier.

3. The transimpedance amplifier integrated circuit of claim 1, further comprising:

a multiplexer for multiplexing the photodiode and a test input to the inverting input of said amplifier according to a prescribed multiplexer control input.

4. The transimpedance amplifier integrated circuit of claim 3, wherein said multiplexer includes a first analog switch for coupling the photodiode to the inverting input or sail amplifier, a second analog switch for coupling the test input to the inverting input of said amplifier, and a shunt regulator for controlling a control voltage of the first analog switch.

5. The transimpedance amplifier integrated circuit of claim 4, wherein the shunt regulator includes a current source PMOS device in series with a diode connected NMOS device.

6. The transimpedance amplifier integrated circuit of claim 1, further comprising:

a tuning circuit for maintaining the first signal at a prescribed constant voltage from a voltage at the source terminal.

7. The transimpedance amplifier integrated circuit of claim 6, wherein the tuning circuit includes a plurality of series MOS devices.

8. The transimpedance amplifier integrated circuit of claim 7, wherein the tuning circuit further includes a temperature compensation component.

9. The transimpedance amplifier integrated circuit of claim 1, further comprising:

a feedback circuit for maintaining the second signal at a voltage equal to that of the first signal plus a voltage proportional to a voltage between the source terminal and the drain terminal.

10. The transimpedance amplifier integrated circuit of claim 9, wherein said feedback circuit includes a distributed bootstrap feedback circuit.

11. The transimpedance amplifier integrated circuit of claim 10, further comprising:

a photodiode coupled between the non-inverting input and the inverting input of said amplifier.

12. The transimpedance amplifier integrated circuit of claim 1, further comprising:

a Tee feedback network circuit coupled to the drain terminal of said MOS resistor device for increasing an effective resistance of said MOS resistor device.

13. The transimpedance amplifier integrated circuit of claim 12, further comprising:

a photodiode coupled between the non-inverting input and the inverting input of said amplifier.

14. The transimpedance amplifier integrated circuit of claim 6, wherein the tuning circuit is further for controlling a voltage of the first signal such that a drain to source resistance of said MOS device is at a prescribed value.

15. A circuit comprising:

an amplifier having an inverting input, a non-inverting input, and an output; and a distributed MOS resistor device having only five terminals, a first, second, and third terminal connected to a first, second, and third voltage source, respectively, a fourth terminal coupled to the inverting input of said amplifier, and a fifth terminal coupled to the output of said amplifier;

wherein the distributed MOS resistor device includes a transistor structure with a drain connected to the fifth terminal, a source connected to the fourth terminal, a channel region disposed between the drain and the source and connected to the third voltage source, a plurality of resistive components connected in series between the first and second voltage sources, and a distributed gate system adjacent to the channel region and including a plurality of intermediate gate terminals connected between the plurality of resistive components.

16. The circuit of claim 15 wherein the third voltage source is a ground voltage.

17. The circuit of claim 16 further comprising:

a diode connected between the non-inverting input and the inverting input of the amplifier.

* * * * *

UNITED STATES PATENT AND TRADEMARK OFFICE
CERTIFICATE OF CORRECTION

PATENT NO. : 6,703,682 B2  
DATED : March 9, 2004  
INVENTOR(S) : Aswell

Page 1 of 1

It is certified that error appears in the above-identified patent and that said Letters Patent is hereby corrected as shown below:

<u>Column 13,</u>
Line 7, the word "sail" should be replaced with -- said --.

Signed and Sealed this

Twenty-fifth Day of May, 2004

JON W. DUDAS  
*Acting Director of the United States Patent and Trademark Office*